US008266408B2

(12) United States Patent
Iyer et al.

(10) Patent No.: US 8,266,408 B2
(45) Date of Patent: Sep. 11, 2012

(54) SYSTEM AND METHOD FOR STORING DATA IN A VIRTUALIZED HIGH SPEED MEMORY SYSTEM

(75) Inventors: Sundar Iyer, Palo Alto, CA (US); Shang-Tse Chuang, Los Altos, CA (US)

(73) Assignee: Memoir Systems, Inc., Santa Clara, CA (US)

( * ) Notice: Subject to any disclaimer, the term of this patent is extended or adjusted under 35 U.S.C. 154(b) by 0 days.

(21) Appl. No.: 12/653,660

(22) Filed: Dec. 15, 2009

(65) Prior Publication Data

US 2011/0167192 A1 Jul. 7, 2011

Related U.S. Application Data

(63) Continuation-in-part of application No. 12/584,645, filed on Sep. 8, 2009.

(60) Provisional application No. 61/161,025, filed on Mar. 17, 2009.

(51) Int. Cl.
*G06F 13/00* (2006.01)

(52) U.S. Cl. .............. 711/206; 711/167; 711/E12.014; 711/E12.044; 711/E12.059

(58) Field of Classification Search .................. 711/103, 711/150
See application file for complete search history.

(56) References Cited

U.S. PATENT DOCUMENTS

| 4,725,945 A | 2/1988 | Kronstadt et al. |
| 5,835,941 A | 11/1998 | Pawlowski |
| 5,860,141 A * | 1/1999 | Washington et al. ......... 711/202 |
| 6,189,073 B1 | 2/2001 | Pawlowski |
| 6,378,032 B1 | 4/2002 | Robertson |
| 6,404,691 B1 | 6/2002 | Fujishima et al. |
| 6,446,157 B1 | 9/2002 | McGehearty et al. |
| 6,801,980 B2 | 10/2004 | Ji et al. |
| 6,948,028 B2 | 9/2005 | Ji et al. |
| 7,047,385 B1 | 5/2006 | Bhattacharya et al. |
| 7,203,794 B2 | 4/2007 | Ji et al. |
| 7,739,460 B1 * | 6/2010 | Carr ............................ 711/155 |
| 7,827,372 B2 * | 11/2010 | Bink et al. .................... 711/165 |
| 2004/0143720 A1 | 7/2004 | Mansell et al. |
| 2006/0129741 A1 * | 6/2006 | Hillier et al. ...................... 711/5 |

(Continued)

FOREIGN PATENT DOCUMENTS

EP 1 006 435 A1 6/2000

OTHER PUBLICATIONS

Hans Mattausch, "Hierarchical N-Port Memory Architecture based on 1-Port Memory Cells", Sep. 16, 1997, Digital Object Identifier:10. 1109/ESSCIR.1997.186178.

Philip Koopman, "Main Memory Architecture", Oct. 19, 1998, Carnegie Mellon University.

(Continued)

*Primary Examiner* — Charles Rones
*Assistant Examiner* — Sean D Rossiter
(74) *Attorney, Agent, or Firm* — Dag Johansen, Esq.

(57) ABSTRACT

A system and method for providing high-speed memory operations is disclosed. The technique uses virtualization of memory space to map a virtual address space to a larger physical address space wherein no memory bank conflicts will occur. The larger physical address space is used to prevent memory bank conflicts from occurring by moving the virtualized memory addresses of data being written to memory to a different location in physical memory that will eliminate a memory bank conflict.

18 Claims, 32 Drawing Sheets

U.S. PATENT DOCUMENTS

2008/0115043 A1* 5/2008 Shimizume et al. ......... 714/807
2008/0133876 A1* 6/2008 Kwon et al. ................. 711/209
2008/0162798 A1* 7/2008 Lofgren et al. .............. 711/103
2008/0183958 A1* 7/2008 Cheriton ...................... 711/108

OTHER PUBLICATIONS

Notification of PCT Search Report and written opinion for related PCT Application, mailed Apr. 20, 2011 (6 pages).

* cited by examiner

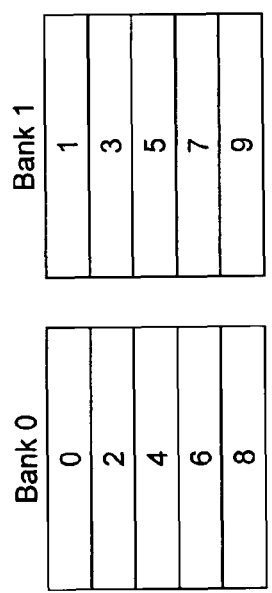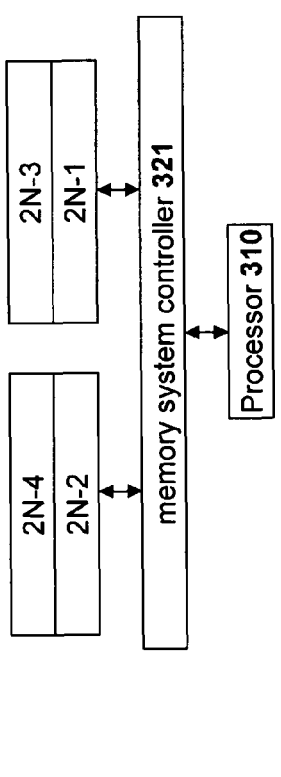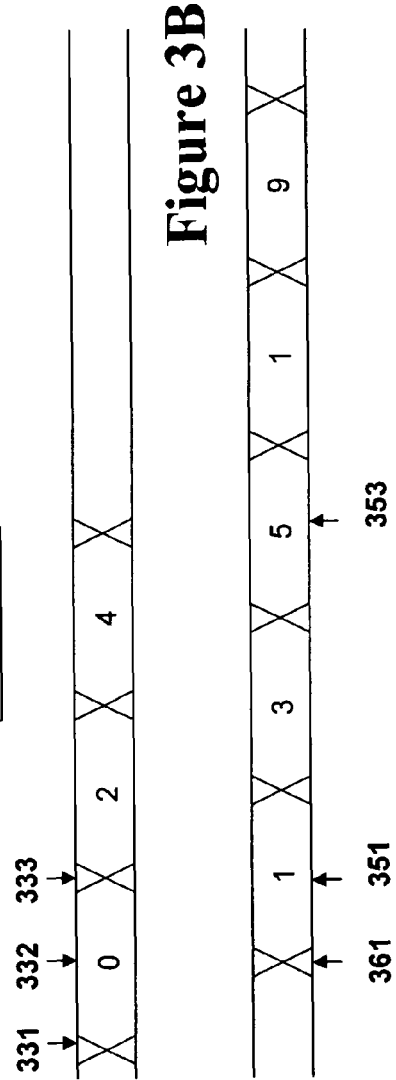

A=000
B=001
C=010
D=011
E=100

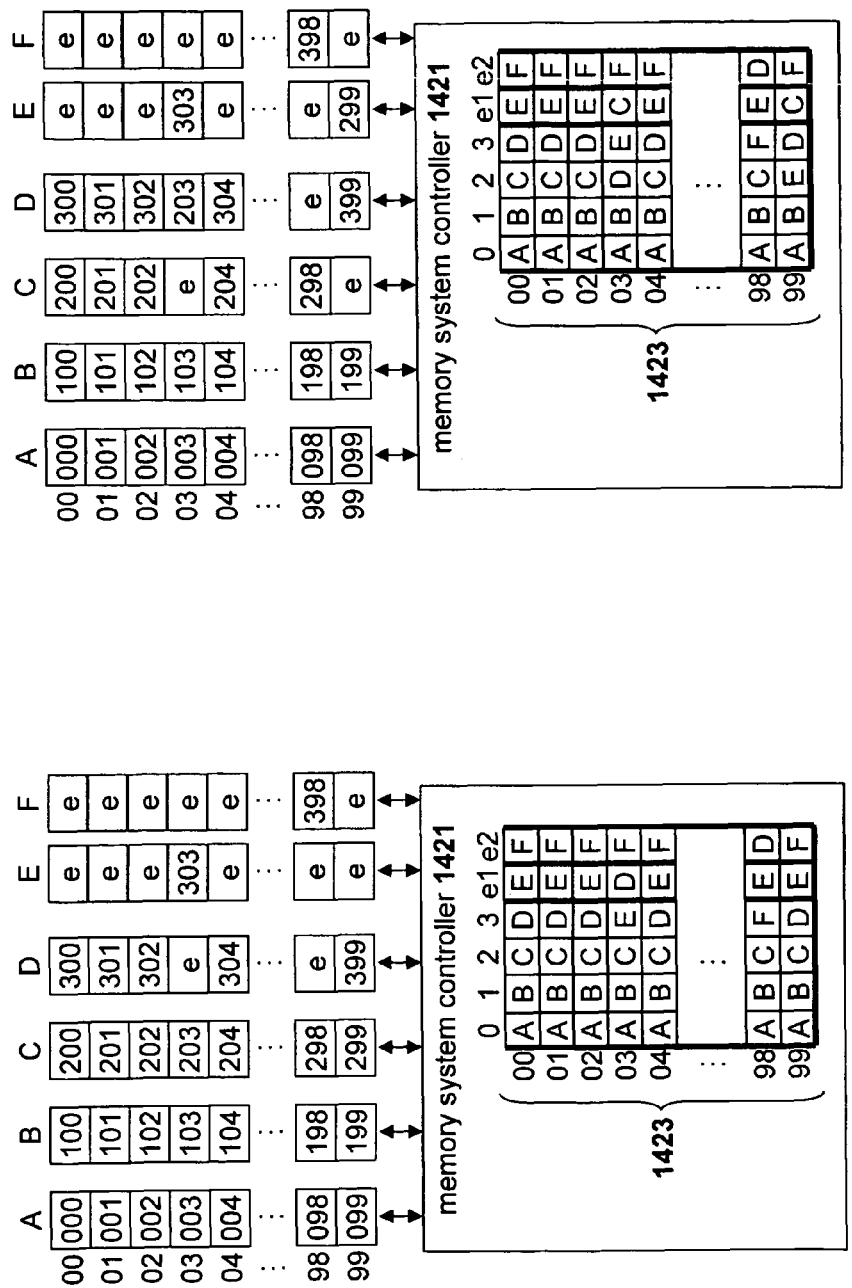

Figure 15F

2R, 2W, = Requires 1 bank

| Write | | |
|---|---|---|
| Read | Read | Write |
| Memory Cycle | | |

| | Write | |
|---|---|---|
| Read | Write | Read |
| Memory Cycle | | |

Figure 15G

2R, 2W, = Requires 1 bank

| | Write | |
|---|---|---|
| Read | Write | Read |
| Memory Cycle | | |

| | Write | |
|---|---|---|
| Write | Read | Read |
| Memory Cycle | | |

Figure 15H

2R, 3W, = Requires 1 bank

| Write | Write | |
|---|---|---|
| Read | Write | Read |
| Memory Cycle | | |

| Write | Write | |
|---|---|---|
| Read | Write | Read |
| Memory Cycle | | |

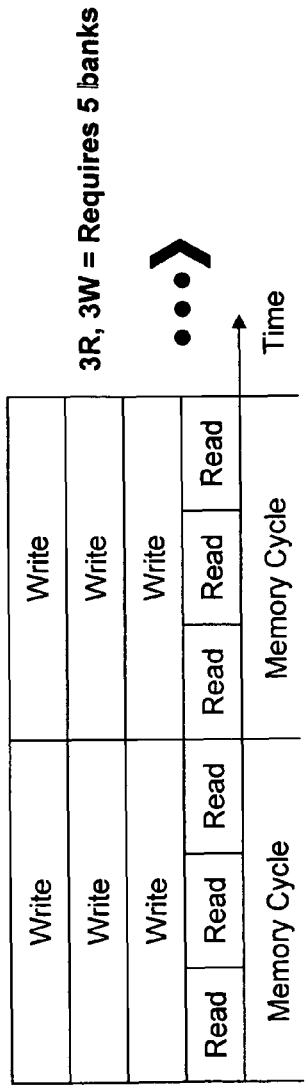
Figure 15K  3R, 3W = Requires 5 banks
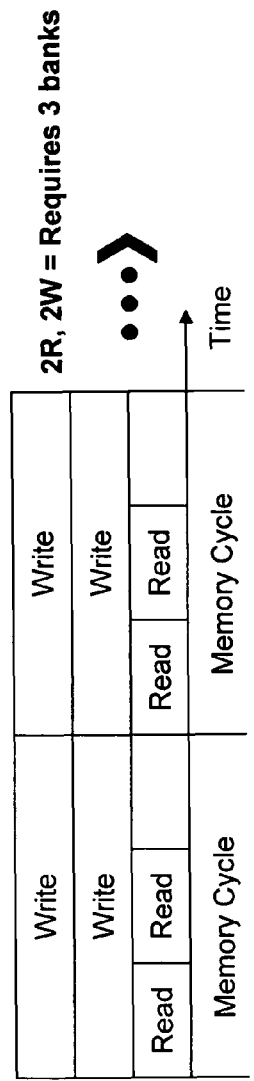
Figure 15L  2R, 2W = Requires 3 banks
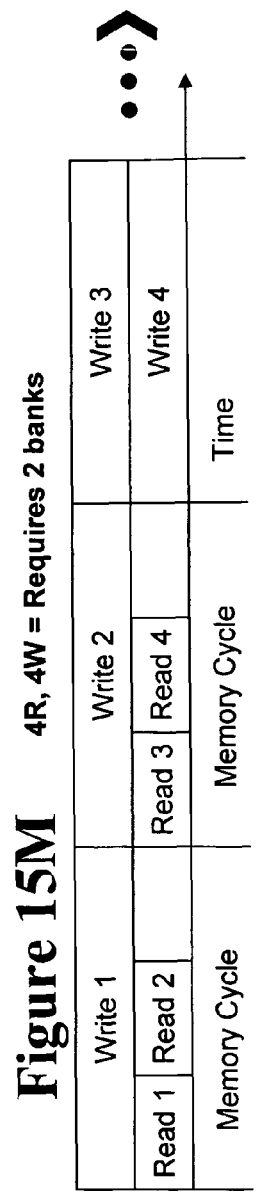
Figure 15M  4R, 4W = Requires 2 banks

SYSTEM AND METHOD FOR STORING DATA IN A VIRTUALIZED HIGH SPEED MEMORY SYSTEM

RELATED APPLICATIONS

The present patent application is a continuation in-part of the previous U.S. patent application entitled "SYSTEM AND METHOD FOR STORING DATA IN A VIRTUALIZED HIGH SPEED MEMORY SYSTEM" filed on Sep. 8, 2009 having Ser. No. 12/584,645 and claims the benefit of the previous U.S. Provisional Patent Application entitled "SYSTEM AND METHOD FOR STORING DATA IN A VIRTUALIZED HIGH SPEED MEMORY SYSTEM" filed on Mar. 17, 2009 having Ser. No. 61/161,025.

TECHNICAL FIELD

The present invention relates to the field of digital computer systems. In particular, but not by way of limitation, the present invention discloses techniques for quickly servicing access requests made to digital memory systems.

BACKGROUND

Most modern computer systems include at least one processor for processing computer instructions and a main memory system that stores the instructions and data processed by the processor. The main memory system is generally implemented with some form of Dynamic Random Access Memory generally known as DRAM. DRAM devices have a very high memory density (amount of data stored per area of integrated circuit used), low power usage, and a relative inexpensive cost. Thus, DRAM devices are used to construct large main memory systems for computer systems.

The speed at which computer processors operate has been continually increasing. Specifically, decreasing the size of the semiconductor transistors and decreasing the operating voltages of these transistors has allowed processor clocks to run at faster rates. However, the performance of DRAM main memory systems that provide data to these faster processors have not kept pace with the increasingly faster processors. Thus, DRAM based main memory systems have become a bottleneck for computer performance. To mitigate this issue, larger Static Random Access Memory (SRAM) based cache memory systems are often used. SRAM devices operate at much faster rates than DRAM devices but have a lower memory density, consume more power, and are more expensive. Furthermore, cache memory systems only provide a speed improvement when a cache "hit" occurs (the needed data is available in the cache memory system). When a cache miss occurs, data must be fetched from the lower speed DRAM memory system. In some applications that require a guaranteed fast performance, the use of cache memory system will not suffice. Thus, it is desirable to improve the speed of memory systems such that memory systems can handle memory read and write operations as fast as possible.

BRIEF DESCRIPTION OF THE DRAWINGS

In the drawings, which are not necessarily drawn to scale, like numerals describe substantially similar components throughout the several views. Like numerals having different letter suffixes represent different instances of substantially similar components. The drawings illustrate generally, by way of example, but not by way of limitation, various embodiments discussed in the present document.

FIG. 3A illustrates an interleaved memory system.

FIG. 3B illustrates a timing diagram illustrating the use of the interleaved memory system of FIG. 3A.

FIG. 14C illustrates the virtualized memory system of FIG. 14B receiving another read and two additional write operations.

FIG. 14D illustrates the state of the virtualized memory system of FIG. 14C after handing the read and the two/write operations of FIG. 14C.

FIG. 15F illustrates a timing diagram for a virtualized memory system that achieves fractional performance increases by performing a write sequentially after read operations in the same memory cycle.

FIG. 15G illustrates the timing diagram of FIG. 15F wherein a parallel write operation has been moved to reduce mapping table memory performance requirements.

FIG. 15H illustrates the timing diagram of FIG. 15G wherein another parallel write operation has been added.

FIG. 15K illustrates the timing diagram for a virtualized memory system that handles 3 reads and 3 writes per memory cycle.

FIG. 15L illustrates the timing diagram for a virtualized memory system that handles 2 reads and 2 writes in 6 nanosecond memory cycle with 3 extra banks.

FIG. 15M illustrates the timing diagram for a virtualized memory system that handles 4 reads and 4 writes in 6 nanosecond memory cycle with 3 extra banks.

FIG. 17C illustrates the state of the virtualized memory system of FIG. 17B receiving another memory write operation.

FIG. 17D illustrates the state of the virtualized memory system of FIG. 17C after handing the write operation.

FIG. 17E illustrates the state of the virtualized memory system of FIG. 17A populated with data values receiving a read operation and a write operation.

FIG. 17F illustrates the state of the virtualized memory system of FIG. 17E after handing the read operation and the write operation.

DETAILED DESCRIPTION

The following detailed description includes references to the accompanying drawings, which form a part of the detailed description. The drawings show illustrations in accordance with example embodiments. These embodiments, which are also referred to herein as "examples," are described in enough detail to enable those skilled in the art to practice the invention. It will be apparent to one skilled in the art that specific details in the example embodiments are not required in order to practice the present invention. For example, although some of the example embodiments are disclosed with reference to computer processing systems used for packet-switched networks, the teachings can be used in many other environments. Thus, any digital system that uses digital memory can benefit from the teachings of the present disclosure. The example embodiments may be combined, other embodiments may be utilized, or structural, logical and electrical changes may be made without departing from the scope of what is claimed. The following detailed description is, therefore, not to be taken in a limiting sense, and the scope is defined by the appended claims and their equivalents.

In this document, the terms "a" or "an" are used, as is common in patent documents, to include one or more than one. In this document, the term "or" is used to refer to a nonexclusive or, such that "A or B" includes "A but not B," "B but not A," and "A and B," unless otherwise indicated. Furthermore, all publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

Computer Systems

Figure 1:
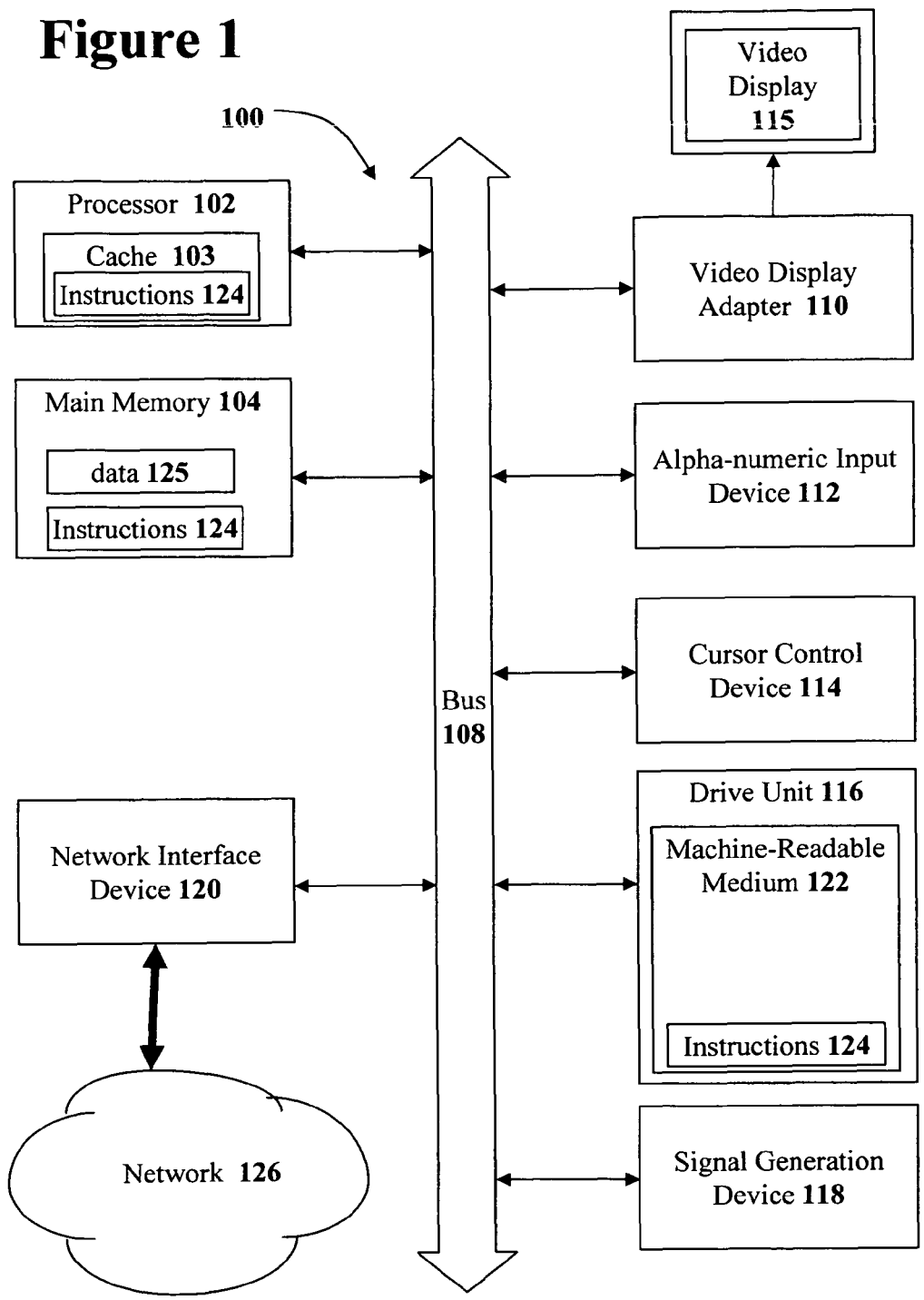
FIG. 1 illustrates a diagrammatic representation of machine in the example form of a computer system within which a set of instructions, for causing the machine to perform any one or more of the methodologies discussed herein, may be executed.

The present disclosure concerns digital computer systems. FIG. 1 illustrates a diagrammatic representation of a machine in the example form of a computer system 100 that may be used to implement portions of the present disclosure. Within computer system 100 of FIG. 1, there are a set of instructions 124 that may be executed for causing the machine to perform any one or more of the methodologies discussed within this document.

In a networked deployment, the machine of FIG. 1 may operate in the capacity of a server machine or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a network server, a network router, a network switch, a network bridge, or any machine capable of executing a set of computer instructions (sequential or otherwise) that specify actions to be taken by that machine. Furthermore, while only a single machine is illustrated, the term "machine" shall also be taken to include any collection of machines that individually or jointly execute a set (or multiple sets) of instructions to perform any one or more of the methodologies discussed herein.

The example computer system 100 of FIG. 1 includes a processor 102 (e.g., a central processing unit (CPU), a graphics processing unit (GPU) or both) and a main memory 104 and a static memory 106, which communicate with each other via a bus 108. The computer system 100 may further include a video display adapter 110 that drives a video display system 115 such as a Liquid Crystal Display (LCD) or a Cathode Ray Tube (CRT). The computer system 100 also includes an alphanumeric input device 112 (e.g., a keyboard), a cursor control device 114 (e.g., a mouse or trackball), a disk drive unit 116, a signal generation device 118 (e.g., a speaker) and a network interface device 120. Note that not all of these parts illustrated in FIG. 1 will be present in all embodiments. For example, a computer server system may not have a video display adapter 110 or video display system 115 if that server is controlled through the network interface device 120.

The disk drive unit 116 includes a machine-readable medium 122 on which is stored one or more sets of computer instructions and data structures (e.g., instructions 124 also known as 'software') embodying or utilized by any one or more of the methodologies or functions described herein. The instructions 124 may also reside, completely or at least partially, within the main memory 104 and/or within a cache memory 103 associated with the processor 102. The main memory 104 and the cache memory 103 associated with the processor 102 also constitute machine-readable media.

The instructions 124 may further be transmitted or received over a computer network 126 via the network interface device 120. Such transmissions may occur utilizing any one of a number of well-known transfer protocols such as the well known File Transport Protocol (FTP).

While the machine-readable medium 122 is shown in an example embodiment to be a single medium, the term "machine-readable medium" should be taken to include a single medium or multiple media (e.g., a centralized or distributed database, and/or associated caches and servers) that store the one or more sets of instructions. The term "machine-readable medium" shall also be taken to include any medium that is capable of storing, encoding or carrying a set of instructions for execution by the machine and that cause the machine to perform any one or more of the methodologies described herein, or that is capable of storing, encoding or carrying data structures utilized by or associated with such a set of instructions. The term "machine-readable medium" shall accordingly be taken to include, but not be limited to, solid-state memories, optical media, and magnetic media.

For the purposes of this specification, the term "module" includes an identifiable portion of code, computational or executable instructions, data, or computational object to achieve a particular function, operation, processing, or procedure. A module need not be implemented in software; a module may be implemented in software, hardware/circuitry, or a combination of software and hardware.

Traditional Virtual Memory

Referring to the example computer system 100 of FIG. 1, the processor 102 executes instructions 124 that are generally fetched from main memory 104 or fetched from an on-chip cache memory 103 within the processor 102 itself. However, the desire to create larger computer programs and handle ever larger data sets created difficulties for computer programmers since the computer programmers would eventually run out of available memory space in the main memory 104. To handle the problem of limited amounts of main memory, the concept of virtual memory was created.

With virtual memory, a very large address space of 'virtual memory' is provided to a computer programmer to work with. However, in reality, the computer system with virtual memory does not actually contain as much physical semiconductor memory that would be needed to represent the entire virtual memory address. Instead, just a subset of the virtual address space is actually available within an integrated circuit implemented memory of the computer system. The rest of the virtual memory space is stored with a slower long term memory system such as a magnetic disc. A conceptual illustration of virtual memory system 220 is presented in FIG. 2.

Figure 2:
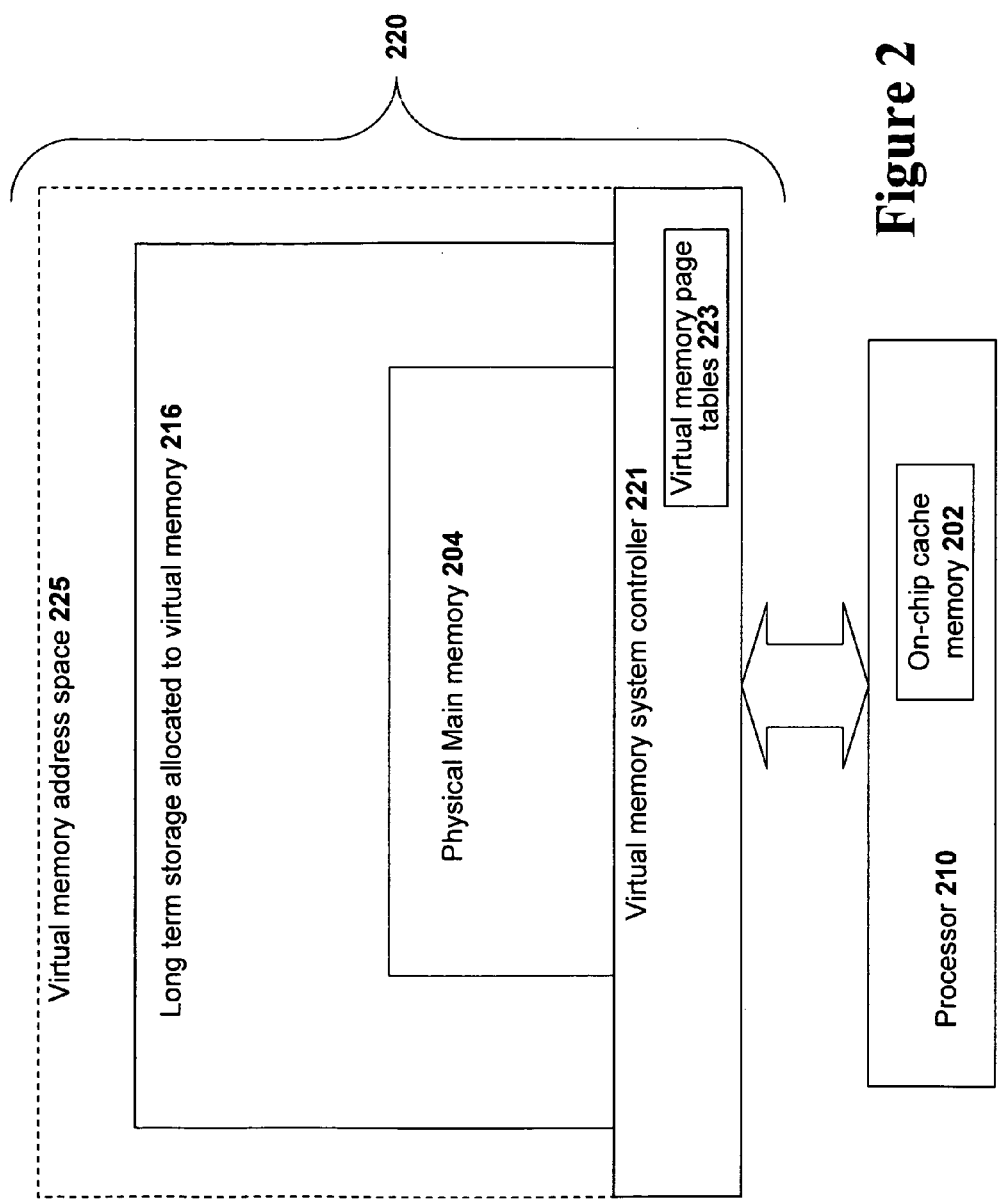
FIG. 2 illustrates a conceptual diagram of a traditional virtual memory system that creates the appearance of a larger main memory system than is actually available.

Referring to FIG. 2, the virtual memory system 220 includes a large virtual memory address space 225 that represents all of the available virtual memory for a computer programmer to use. The processor 210 uses virtual addresses to access instructions and data in the large virtual memory address space 225 through a virtual memory system controller 221. The virtual memory system controller 221 is responsible for handling all memory access requests to the virtual memory system. (Note that the processor 210 may also include an on-chip cache memory 202 which represents a duplication of a small subset of the available memory.)

With a virtual memory system 220, only a currently needed subset of instructions and data from the large virtual address space 225 is actually physically represented within a real physical main memory 204 of the computer system. The virtual memory controller 221 is responsible for translating virtual memory addresses into physical memory addresses with in the physical main memory 204. This physical main memory 204 is typically implemented with semiconductor memory devices such as dynamic random access memory devices.

All of the other computer instructions and data that have been loaded into the virtual memory address space 225 but are not represented in the physical main memory 204 are stored in a long term storage system 216. In a typical personal computer system, this long term storage is typically provided by hard disk drive unit 116 as depicted in FIG. 1. (Other systems may use alternatives such as flash memory as a long term storage system.) Note that virtual address space 225 may be larger than the portion long term storage system 216 currently allocated for use with the virtual memory system 220 since the processor 210 may have not accessed certain parts of the virtual memory address space and thus the state of that unaccessed region of virtual memory is undefined. However, when the processor 210 accesses those previously untouched portions of the virtual address space then the virtual memory system 221 will allocate additional long term storage space 216 from the long term memory system to handle those newly accessed areas of the virtual memory address space 225. Many virtual memory systems allocate a region of long term storage equal to the entire size of the virtual memory address space to ensure that sufficient long term storage will always be available to the virtual memory system 220.

The virtual memory system controller 221 is responsible for ensuring that currently needed instructions and data from the virtual memory address space 225 are loaded into the physical main memory 204. If a needed section of virtual memory address space 225 is not currently represented in the physical main memory 204 then the virtual memory system controller 221 reads that section of virtual memory address space from the long term storage system 216 and brings it into the real main memory 204. In order to make space for the new section of virtual address space needed, the virtual memory system controller 221 will move a section of instructions and data currently represented in the real main memory 204 out to the long term storage 216. This technique of moving sections of memory into and out of the main memory system often referred to as 'swapping'. Numerous algorithms exist to help determine which particular section of memory will be least likely to be accessed soon in order to reduce the number of swaps that must be performed.

As set forth above, the concept of virtual memory allows a small amount of real physical main memory 204 to represent a much larger amount virtual memory address space 225 with the help of additional storage space allocated from long term storage 216. However, this ability to represent a much larger virtual memory address space than the actual physical memory address space available comes at a cost. Specifically, the average performance of the overall memory system will be slower since data in the slower long term storage system 216 must be accessed when a needed section of the virtual memory address space 225 is not currently represented in the main memory 204.

High-Speed Memory Techniques

For some demanding applications, the use of long term storage is not a viable option due to high-bandwidth memory needs. For example, in a high-speed network device such as a network router, the network router must rapidly store incoming data packets from a first data communication link into a memory system. The router must later read the stored data packets back from the memory system for transmission on another data communication link. These writing and reading of data packets must all be performed at a very high speed in order to keep the data communication links filled with data. Thus, a virtual memory system cannot be used in such an application.

Thus for certain applications, such as the packet routing application described above, a fast memory response is needed for every memory location used to store data. For these applications requiring consistent fast memory performance, the entire memory system may be constructed with real physical memory devices. In this manner, every memory location will be able to store and recall data at the full speed of the integrated circuit memory devices used to construct the memory system.

However, even with an entire main computer memory system constructed using traditional Dynamic Random Access Memory devices; the memory system may still not provide the desired memory performance for some very demanding applications. The very high speed of modem processors and digital communication links have caused memory systems to become the performance bottleneck that is limiting overall computer system performance increases. New techniques are needed to satisfy the extremely high memory performance requirements of certain computer applications.

Referring to FIG. 2, one obvious solution would be to greatly increase the size of the on-chip cache memory 202 implemented within a processor 210. If all of the high-speed memory needs for a particular application can be satisfied by the limited address space within on-chip cache memory 202 then this technique can be used. However, this is not a completely satisfactory solution for many different reasons. A computer processor with a very large on-chip cache memory 202 will require a large integrated circuit die size such that processor yields (the percent of fully-operable integrated circuits from a batch of integrated circuits made) will go down. Furthermore, with less integrated circuit die area for the processor circuitry, the processor circuitry cannot be made too complex. Due to its limitations, a computer processor constructed with a very large cache memory system would be a niche product and thus expensive since a large market will not exist for that processor. However, the biggest problem with this solution is that many applications will simply require a much larger memory address space than can be implemented with an on-chip cache memory 202. Thus, new techniques for improving the performance of main memory systems are required.

Another technique that may be used is to construct an entire memory system using memory designs, such as Static Random Access Memory (SRAM), that provide the best memory performance possible. This technique has been used in some applications that require the optimum memory performance. However, this is not a desirable solution since SRAM devices are expensive, have a low memory density, and consume large amounts of power. Thus, techniques for obtaining better performance from high density memory devices, such as DRAMs, are needed.

Interleaved Memory Banks

One common property of DRAM memory devices is that when a first memory request is made to a memory device then that DRAM memory device will respond quickly. However, if an immediate consecutive memory request is made to any memory address within that same memory device, the memory device will not be able to respond as fast as it was able to respond to the first memory request. The reason for this is that, internally, the memory must perform some type of maintenance action to complete the first memory access cycle. For example, with DRAM devices, the DRAM memory device must perform a refresh to the memory row that was read out of the memory matrix before responding to subsequent memory requests.

Memory systems can take advantage of the fact that memory devices respond with data before completing a full memory cycle by organizing the memory address space into various independent memory banks wherein each memory bank is constructed from different memory devices. Then, these memory banks are interleaved in a manner that will cause most consecutive memory access requests to access a different memory bank. In this manner, the computer system will enjoy the fast memory response of an initial memory access for most memory accesses. As long as the time to complete the refresh of the memory before being ready for a subsequent access is less than the response time for data after initiating a read cycle, each memory bank will be ready to respond to every other memory request with a fast response time.

FIG. 3A illustrates an example of a simple two-way interleaved memory system. In the two-way interleaved memory of FIG. 3A there are two memory banks: Bank 0 and Bank 1. The two memory banks are independent such that when bank 0 is currently busy completing a memory operation then bank 1 will be immediately available to respond quickly to a memory access. (Similarly, when bank 1 is currently busy completing a memory operation then bank 0 is will be available.) The addressing scheme for the memory system is interleaved such that every immediately sequential address is in a different memory bank than the previous address. Thus, as illustrated in FIG. 3A, address 0 is in bank 0, address 1 is in bank 1, address 2 is in bank 0, address 3 is in bank 1, and so on.

When a computer program executes, the processor in the computer system generally needs to read in computer instructions that are organized consecutively in memory. Thus, when consecutively reading the memory addresses from the memory system of FIG. 3A each consecutive memory access will be from a different memory bank than the previous memory access. First address 0 in bank 0 is read, then address 1 in bank 1 is read, then address 2 in bank 0 is read, then address 3 in bank 1 is read, and so on. Since the two memory banks are independent, the accesses to a different memory bank may occur while another memory bank is still busy completing a previous memory access operation. Thus, the memory accesses can be staggered as illustrated in FIG. 3B to greatly improve the performance of the memory system.

Referring to FIG. 3B, the processor may first request address 0 at time 331. Bank 0 will respond with the data from address 0 at the time 332. But at time 332 Bank 0 cannot immediately accept another memory request since Bank 0 must perform some internal action (such as a memory refresh). However, since the next sequential memory access is to address 1 within memory bank 1 which is not busy, the request to address 1 can be issued immediately at time 361. While bank 1 is responding to the memory request to address 1, bank 0 is finishing the internal operations needed after the access to address 0. When bank 1 responds with the data from address 1 at time 351 then bank 0 will be ready for another memory request at time 333. Therefore, the computer processor can issue a memory access request to address 2 at time 333. Thus, an interleaved memory system can be used to help mask the total read cycle of DRAM devices.

This technique of interleaving memory only provides a performance improvement as long as you are accessing a different memory bank after each memory access. If an immediate successive memory access request is to the same memory bank that was just accessed, the performance increase will not be achieved. For example, if after obtaining data from memory address 5 at time 353 the processor then needs to access memory address 1 (such as if there is a program loop back to address location 1) then the processor must wait for bank 1 to complete the internal actions associated with the previous memory access to memory address 5 before attempting to access memory address 1 located within the same memory bank. And if the processor then immediately accesses another memory address in bank 1, such as memory address 9, then the memory system will again have to wait for bank 1 to complete the previous memory access to address 1. Thus, there will be no more overlapping memory access with bank 0. Thus, the advantages of interleaved memory are lost when there are successive memory accesses to the same memory bank.

To increase the performance of memory operations in an interleaved system, a computer programmer can attempt to write a computer program in a manner that avoids accessing the same memory bank successively when accessing program data. Although this is possible, it is very difficult and time-consuming for computer programmers to carefully craft their computer code to deal with such constraints. Furthermore, the vast majority of computer software development is done in high-level computer languages such as C, C++, Pascal, FORTRAN, etc. These high-level programming languages lack any features to handle such memory bank constraints such that programming would need to be done in assembly language that is very difficult to work with.

Accessing Independent Memory Banks in Parallel

As set forth with reference to FIGS. 3A and 3B, the operation of different memory banks may be completely independent of each other. Thus, two completely independent memory access operations can be performed on two different memory banks simultaneously. This allows for the creation of high speed memory systems that achieve their high memory bandwidth by serving multiple consumers of memory simultaneously. By allowing two different users of a memory system to access independent memory banks simultaneously, the effective memory bandwidth for the memory system is doubled.

Figure 4A:
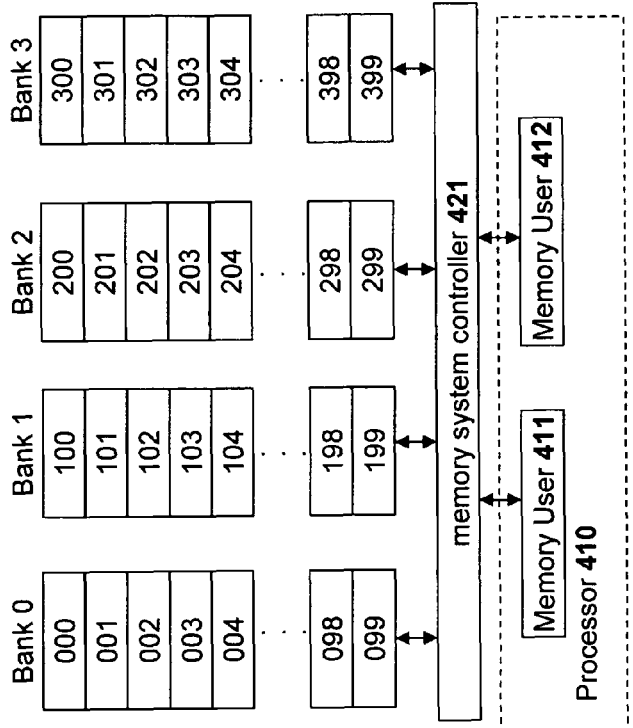
FIG. 4A illustrates a memory system having multiple independent memory banks.

FIG. 4A illustrates an example of a memory system having four independent memory banks (memory banks 0, 1, 2, and 3) that allow multiple memory requests to be received from two different memory user 411 and memory user 412. As long as the two memory users (411 and 412) access different memory banks then those two memory users can share the memory system simultaneously and operate without stalling. Thus, as illustrated in the timing diagram of FIG. 4B, memory user 411 can access memory address 000 while memory user 412 accesses memory address 101. Then memory user 411 can access memory address 202 while memory user 412 accesses memory address 304.

Figure 4B:
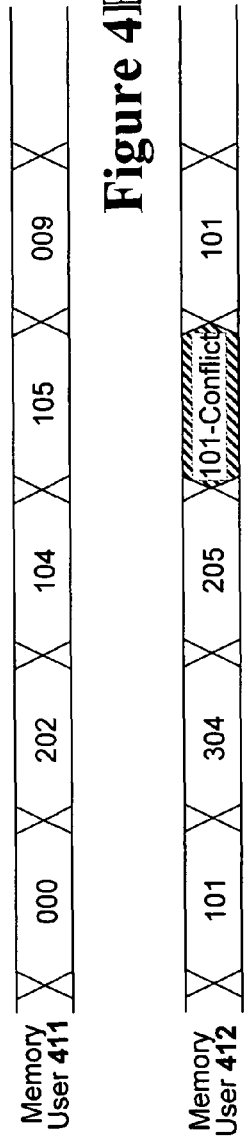
FIG. 4B illustrates a timing diagram illustrating the use of the multiple bank memory system of FIG. 4A.

However, if the two memory users (411 and 412) attempt to access the same memory bank, then at least of the memory users must be stalled. For example, in the fourth data period illustrated in FIG. 4B, memory user 411 accesses memory address 105 while memory user 412 attempts to accesses memory address 101. Since memory address 105 and memory address 101 are in the same memory bank (memory bank 1), one of the two memory users (411 or 412) must be delayed. In the example of FIG. 4B, memory user 411 is giving priority such that memory user 412 is stalled since its memory access of memory address 101 cannot be completed until after waiting for memory user 411 to complete its access of memory address 105.

The preceding description of the memory system disclosed in FIG. 4A was made with reference to two individual memory users: memory user 411 and memory user 412. However, the memory system disclosed in FIG. 4A can just as easily be used with a single memory user that is operating at twice the speed of memory user 411 and memory user 412. If processor 410 operates at twice the clock speed of memory users 411 and 412, then processor 410 will be able to issue two memory requests in the single clock cycle used by memory users 411 and 412. These two memory requests can be presented to memory system controller 421 simultaneously. Thus, from the perspective of memory system controller 221, a single entity issuing memory requests at twice the speed is very similar to two entities issuing memory requests at a normal speed.

In order to maximize the memory bandwidth for the memory system illustrated in FIG. 4A, the programmers for such a system should carefully construct their computer code such that memory bank conflicts are minimized. However, as set forth earlier, creating such constraints makes the programming for such a system difficult and time-consuming. And as noted earlier, high-level programming languages do not have features that will allow a programmer to ensure such constraints are being observed.

In an ideal memory system, multiple different entities could access any address location of that memory system simultaneously. None of the simultaneous memory accesses to any memory location in this ideal system would cause any memory bank conflict that would stall the system. Furthermore, this ideal memory system would not impose any special programming constraints such that a programmer could use any high-level programming language without worrying about when a memory conflict would occur or not.

A New Paradigm for High-Speed Memory Systems

To construct a real memory system that is closer to an ideal memory system that allows multiple entities to access memory with very few constraints, the present disclosure introduces a "virtualized memory system". The virtualized memory system accomplishes this goal without imposing any specific programming restraints upon the user of the virtualized memory system. The virtualized memory system of the present disclosure allows for a simultaneous read and write operations to the same apparent memory bank with suffering the penalties typically associated a memory bank conflict.

The virtualized memory system operates in a manner analogous to traditional virtual memory as disclosed with reference to FIG. 2. Like traditional virtual memory, the high-speed virtualized memory system of the present disclosure allows computer programmers to work in a virtualized memory address space without having to worry about the specific details of how the virtualized memory system specifically handles the storage and retrieval of data in a real physical memory address space. Instead, a virtualized memory controller translates all memory access requests made to a virtualized memory address space into a physical memory address space. However, the virtualized memory controller accomplishes this address space translation in a manner that prevents any memory bank conflicts from affecting the performance of the entity that is using the virtualized memory system. Thus, optimum memory performance is achieved from the perspective of the entities sending memory access requests to the virtualized memory system.

Behind the scenes, a virtualized memory controller translates the memory requests made in a virtualized address space into a real physical address space using a set of address space mapping tables that ensure there will be no memory bank conflicts that will reduce performance of the entity (or entities) accessing the virtualized memory system. In order to accomplish this goal, the virtualized memory controller maps the virtualized memory address space to a larger physical address space. Using the larger physical memory address space, the virtualized memory system hides the effects of any potential memory bank conflicts from the user of the virtualized memory system. Thus, whereas traditional virtual memory system (such as the one disclosed with reference to FIG. 2) maps a larger virtual address space 225 onto a smaller physical memory address space 204 in order to achieve the appearance of a larger memory space; the virtualized memory system of the present disclosure maps a smaller virtualized address space onto a larger physical memory address space in a manner that achieves an improved memory performance.

Figure 5:
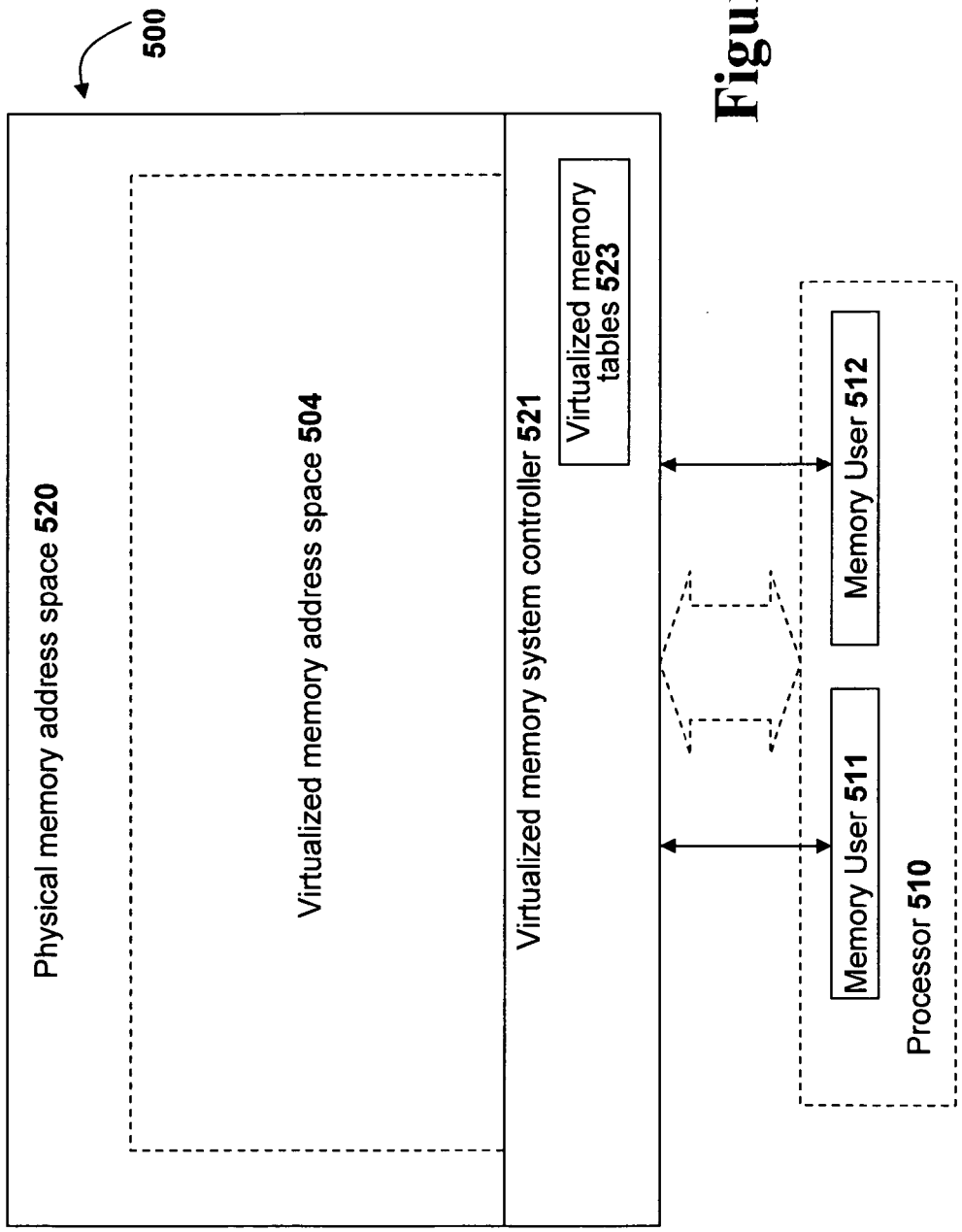
FIG. 5 illustrates a conceptual diagram of a virtualized memory system that uses additional physical memory to make a smaller virtualized memory space provide better performance.

FIG. 5 illustrates a conceptual diagram of a basic virtualized memory system 500 that uses the teachings of the present disclosure. In the memory system disclosed in FIG. 5, memory user 511 and memory user 512 access the same virtualized memory system 500. As with the memory system disclosed in FIG. 4A, the concurrent memory requests to the virtualized memory system 500 may be from a single entity operating at twice the speed of two individual entities. Thus, processor 510 operating at twice the clock speed of memory user 511 and memory user 512 could issue two consecutive memory requests that would appear as two memory requests received concurrently by virtualized memory system 500.

All of the memory access requests to the virtualized memory system 500 are handled by a virtualized memory system controller 521. The virtualized memory system controller 521 receives memory access requests (reads, writes, or other memory commands) containing virtualized memory addresses, translates all the virtualized memory addresses (in the virtualized memory address space 504) into real physical memory addresses in a larger physical memory address space 520, and then accesses the requested information using the physical addresses in the physical memory address space 520. The virtualized memory system controller 521 performs this virtualized to physical address space translation with the aid of one or more virtualized memory tables 523 in the virtualized memory system controller 521. The end result of the virtualized to physical address space translation is that patterns of memory access requests from memory user 511 and memory user 512 that would typically cause performance-reducing memory bank conflicts in a prior memory system (such as the system illustrated in FIG. 4A) do not cause any memory bank conflicts from the perspective of memory user 511 and memory user 512. All of the potential memory bank conflicts are eliminated by the use of a variety of techniques.

Figure 6A:
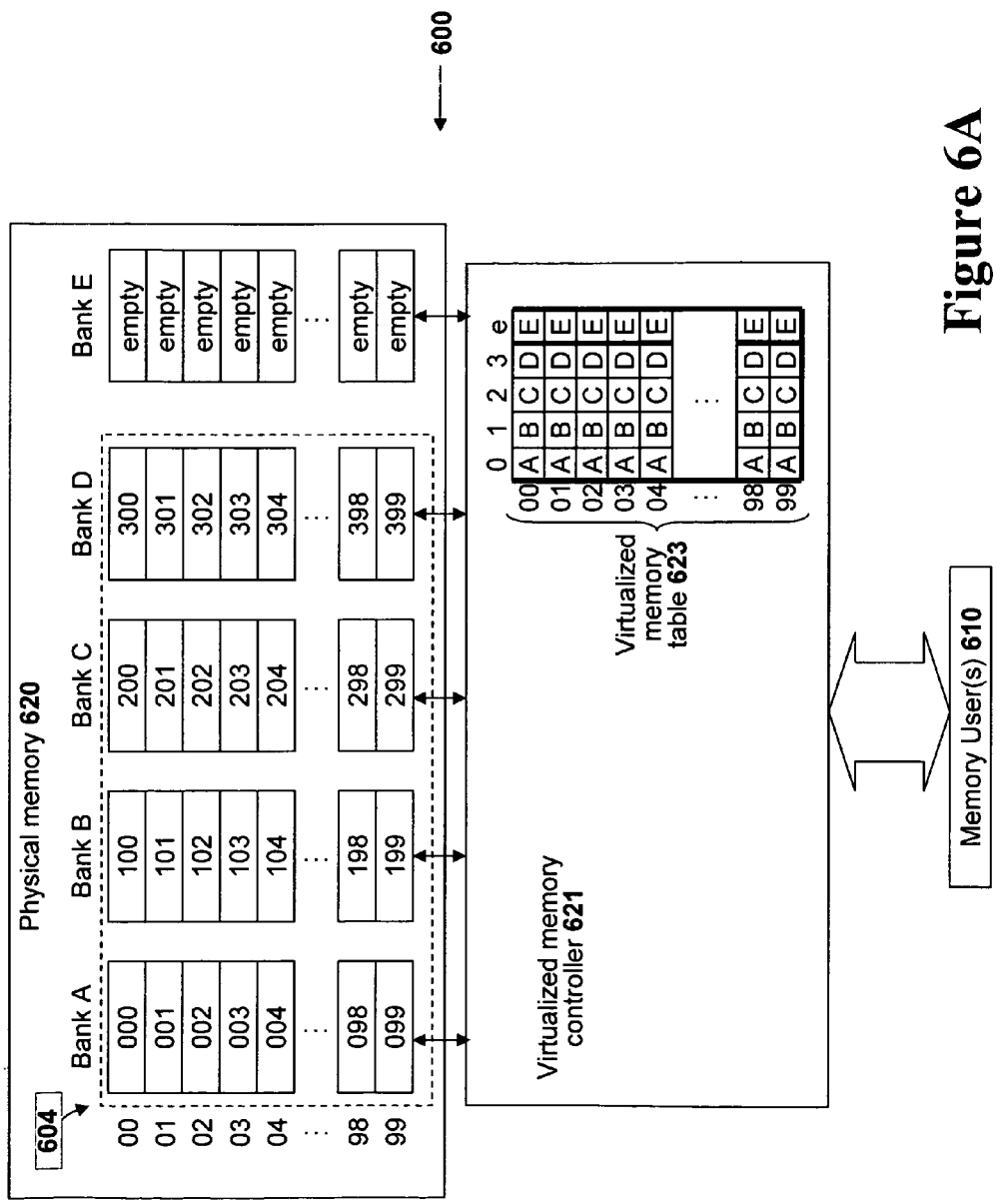
FIG. 6A illustrates a block diagram of a first implementation of a virtualized memory system.

One of the important differences between the virtualized memory system 500 and typical prior memory systems is that the memory system has been "doped" with additional memory devices. These additional memory devices make the physical address space 520 of the virtualized memory system 500 larger than the virtualized memory address space Virtualized Memory System Internal Organization FIG. 6A illustrates a block diagram of a first embodiment of a virtualized memory system 600 according to the teachings of the present disclosure. As previously depicted in the conceptual diagram of FIG. 5, the virtualized memory system 600 mainly consists of a virtualized memory system controller 621 and physical memory array 620. The example depicted in FIG. 6A and in the following description will provide specific numbers of memory banks, memory addresses, etc. However, it will be obvious to one skilled in the art that these are just numbers for this one example implementation. Various different memory system sizes may be constructed using very different numbers of memory banks, memory addresses, etc.

Referring to FIG. 6A, the physical memory array 620 is organized into five independent memory banks (Bank A to E) having 100 rows each. For ease of explanation, this document will refer to memory bank sizes and memory addresses with base 10 (decimal) numbers but most actual implementations would use an even multiple of 2 for a base 2 (binary) address system. In the virtualized memory system 600 embodiment of FIG. 6A that has five memory banks with 100 rows in each memory bank, there are 500 unique physical memory addresses in the physical memory 620.

As set forth in the conceptual diagram of FIG. 5, the virtualized memory system 600 presents a virtualized memory address space to users of the virtualized memory system 600 that is smaller than the actual physical address space. Thus, in the embodiment of FIG. 6A, an initial virtual memory address space 604 (surrounded by a rectangle made of dotted lines) comprising virtualized memory addresses 000 to 399 is represented within physical memory banks A to D. Physical memory bank E does not initially represent any of the virtualized memory locations such that memory bank E's memory locations are marked 'empty'. As depicted in FIG. 6A, this document will specify a virtualized memory address that is currently being represented by a physical memory location as a three-digit virtualized memory address within the box of the physical memory location. For example, the physical memory location at row 00 of Bank B initially represents virtualized memory address 100 such at '100' is depicted within the box at row 00 of memory bank B. As will be set forth later in this document, the actual locations of the various virtualized memory addresses will move around in the physical memory space 620. Thus, the virtual memory address space 604 organization depicted in FIG. 6A only represents one possible state of many.

The virtualized memory system controller 621 is responsible for handling all virtualized memory access requests from the memory user(s) 610. The memory system controller 621 translates virtualized memory addresses (the 000 to 399 addresses in FIG. 6A) into actual physical memory addresses (identified in FIG. 6A by the memory bank letter and the row within that memory bank) within the physical memory 620. To accomplish this virtualized to physical address translation task, the memory system controller 621 uses at least one virtualized memory mapping table 623.

In the first virtualized memory system embodiment of FIG. 6A, virtualized memory addresses are split into a most significant digit (the first digit of a three digit virtualized address) and two least significant digits (the second two digits of a three digit virtualized address). In, the specific embodiment of FIG. 6A, the virtualized memory system uses the least significant digits of virtualized memory address (the second two digits of the virtualized memory address) as the physical row designation in the physical memory system. Thus, there is no translation needed for the two least significant digits of the virtualized memory address since they are the same as the two least significant digits of the physical memory address.

The most significant digit of a virtualized memory address must still be translated into a physical memory address. In the system of FIG. 6A, the most significant digit of a virtualized memory address is translated into a physical memory bank. To perform the translation, the virtualized memory mapping table 623 includes a number of rows equal to the number of rows in the memory banks and a number of columns equal to the number of most significant address digit possibilities (0, 1, 2, and 3 in this example of a virtualized address space from 000 to 399). To translate from the virtualized memory address to the physical memory location, the virtualized memory system controller 621 examines the entry of the virtualized memory mapping table 623 having the same row of the virtualized memory address' two least significant digits and the same column as the virtualized memory address' most significant digit. For example, to translate virtualized address 304 to a physical memory location, the virtualized memory system controller 621 consults the entry of column '3' and row '04' to obtain 'D' as the memory bank that currently represents virtualized address 304 (in row 04).

In addition to the 0 to 3 columns, the virtualized memory mapping table 623 embodiment of FIG. 6A also includes a column labelled "e". This column is used to identify a memory bank containing an empty memory location at the designated row. For example, row '02' of column 'e' in the virtualized memory mapping table 623 lists 'E' as a memory bank with an empty location. However, this column need not be implemented since the memory bank with an empty memory location in that particular row can be inferred by determining the memory bank designation (A, B, C, D, or E) not represented in the 0 to 3 columns of that same row.

Figure 6B:
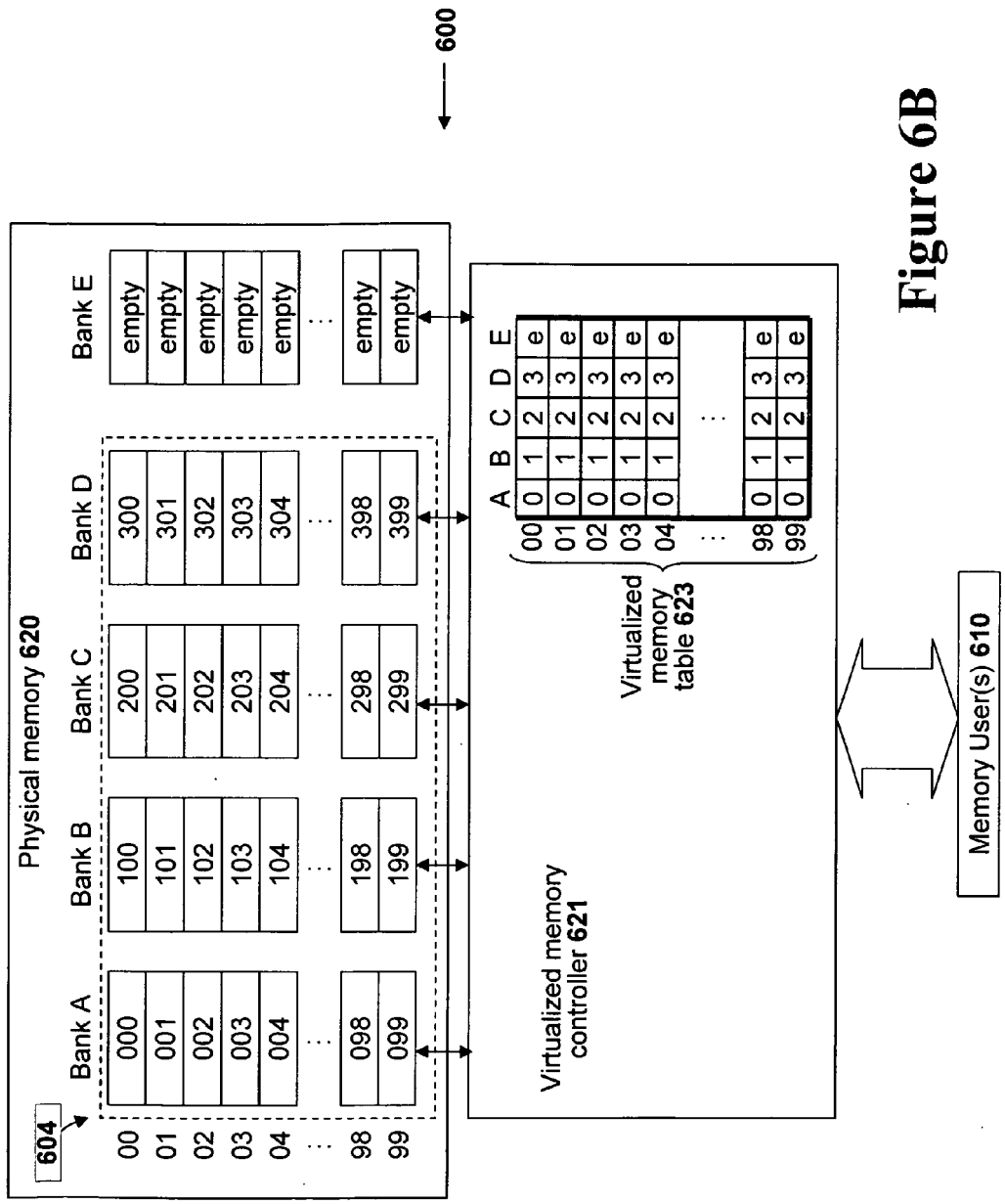
FIG. 6B illustrates a block diagram of a second implementation of a virtualized memory system.

FIG. 6B illustrates a block diagram of a second embodiment of a virtualized memory system 600. In the alternate embodiment of FIG. 6B, there is the same number of columns in the virtualized memory table 623 as there are memory banks in the physical memory. In this manner, there is both a one-to-one correspondence between the columns of virtualized memory table 623 and the memory banks and a one-to-one correspondence between the rows of virtualized memory table 623 and the rows in the physical memory banks. Each entry in the virtualized memory table 623 of FIG. 6B specifies the most significant digit of the virtual memory address that is currently represented in the corresponding memory bank and row. Thus, in the initial condition, Bank A of the physical memory 620 contains addresses 000 to 099 such that every entry in the Bank A column of virtualized memory table 623 contains a '0'. (Again, note that this example is using decimal values only to simplify the explanation. An actual implementation would likely use a set of most significant bits from a binary virtualized memory address.) Similarly, in the initial condition, Bank B of the physical memory 620 contains addresses 100 to 199 such that every entry in the Bank B column of virtualized memory table 623 contains a '1'. And so on for memory banks C and D. In the initial state illustrated in FIG. 6B, memory bank E does not represent any information from the virtualized memory address space and thus has the corresponding column E entries marked 'e' since bank E does not currently contain any information stored in the virtualized addresses.

Handling a Simultaneous Read and Write

The virtualized memory system 600 of FIGS. 6A and 6B is configured to handle a read request with a simultaneous write request to any other address in the virtualized memory system 600 without ever forcing the memory user(s) 610 to stall due to a memory bank conflict. Thus, even if the read request and the write request are to the same memory bank (which would cause a memory bank conflict in most memory systems), the virtualized memory system 600 will handle the request without stalling the memory user(s) 610. Thus, the virtualized memory system 600 provides a guaranteed memory bandwidth such that all applications which require a guaranteed memory access time can use the virtualized memory system 600.

It should be noted that one situation that cannot be dealt with easily is when both a read and a write are received at the same time for the exact same virtualized address. Normally, a memory user should never issue such a pair of simultaneous requests since there is really no reason to read an address when that same address is being written to by the same entity. However, if such a case occurs, the reader may be given the original data or the newly written data depending on the implementation.

As set forth earlier with reference to FIGS. 4A and 4B, a multi-bank memory system with independent memory banks can easily handle multiple simultaneous memory access requests as long as the memory access requests are directed to different memory banks in the memory system. For example, referring to FIG. 6A, one memory user could write to Bank A in while another memory user reads from Bank C with no memory bank conflicts since the memory banks are independent. However, when two simultaneous memory access requests are directed to the same memory bank, then a memory bank conflict occurs.

The virtualized memory system controller 621 handles memory bank conflicts wherein a read operation and a write operation are simultaneously issued to the same memory bank by moving the virtualized memory address for the write operation to an unused memory location in a different memory bank. The unused memory location is determined by reading the virtualized memory table 623 to determine an unused memory location and then updating the virtualized memory table 623 with the new location of the virtualized memory address.

Figure 7B:
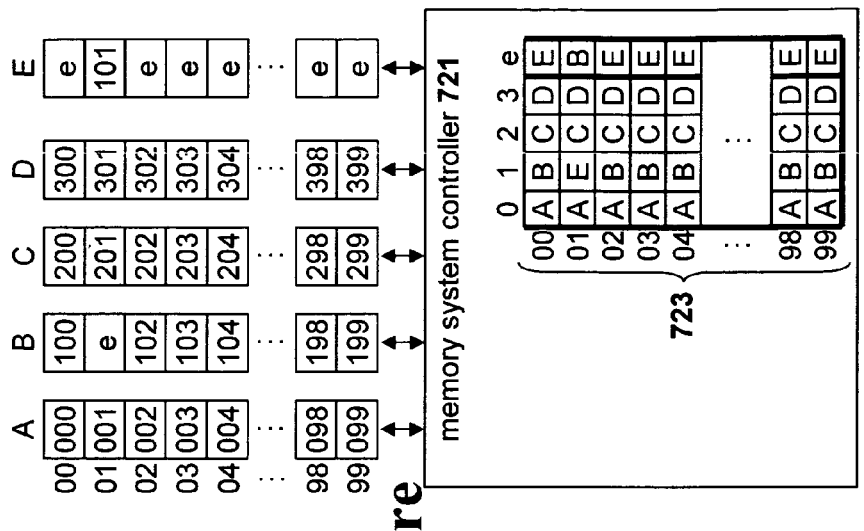
FIG. 7B illustrates the state of the virtualized memory system of FIG. 7A after processing the read and write operations.
Figure 7A:
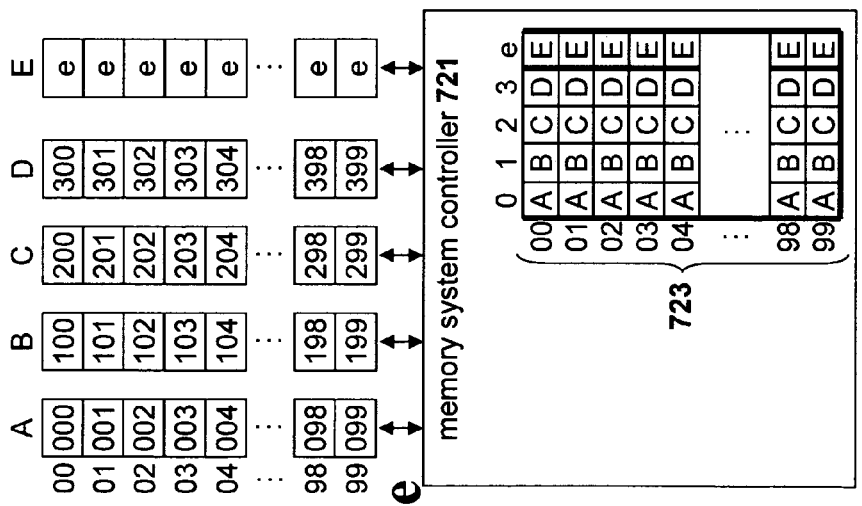
FIG. 7A illustrates an initial starting state for a virtualized memory system receiving simultaneous read and write operations.

The technique is best described with the use of examples. An example operation of the virtualized memory system 600 embodiment of FIG. 6A is set forth with reference to FIGS. 7A, 7B, and 8. FIG. 7A illustrates the same virtualized memory system 600 of FIG. 6A in the same initial condition. If the virtualized memory system controller 721 simultaneously receives a memory write to virtualized address 101, written as W(101) in FIG. 7A, and memory read to virtualized address 103, written as R(103), this memory access pattern would normally cause a memory bank conflict since both virtualized address 101 and 103 are in the same memory bank (memory bank B). To prevent the memory bank conflict, the virtualized memory system controller 721 allows the read of virtualized address 103 to proceed as normal in physical memory bank B but handles the write to virtualized address 101 using a different memory bank. The data currently residing in the current virtualized address 101 is no longer relevant since a new data value is being written to virtualized address 101.

Figure 8:
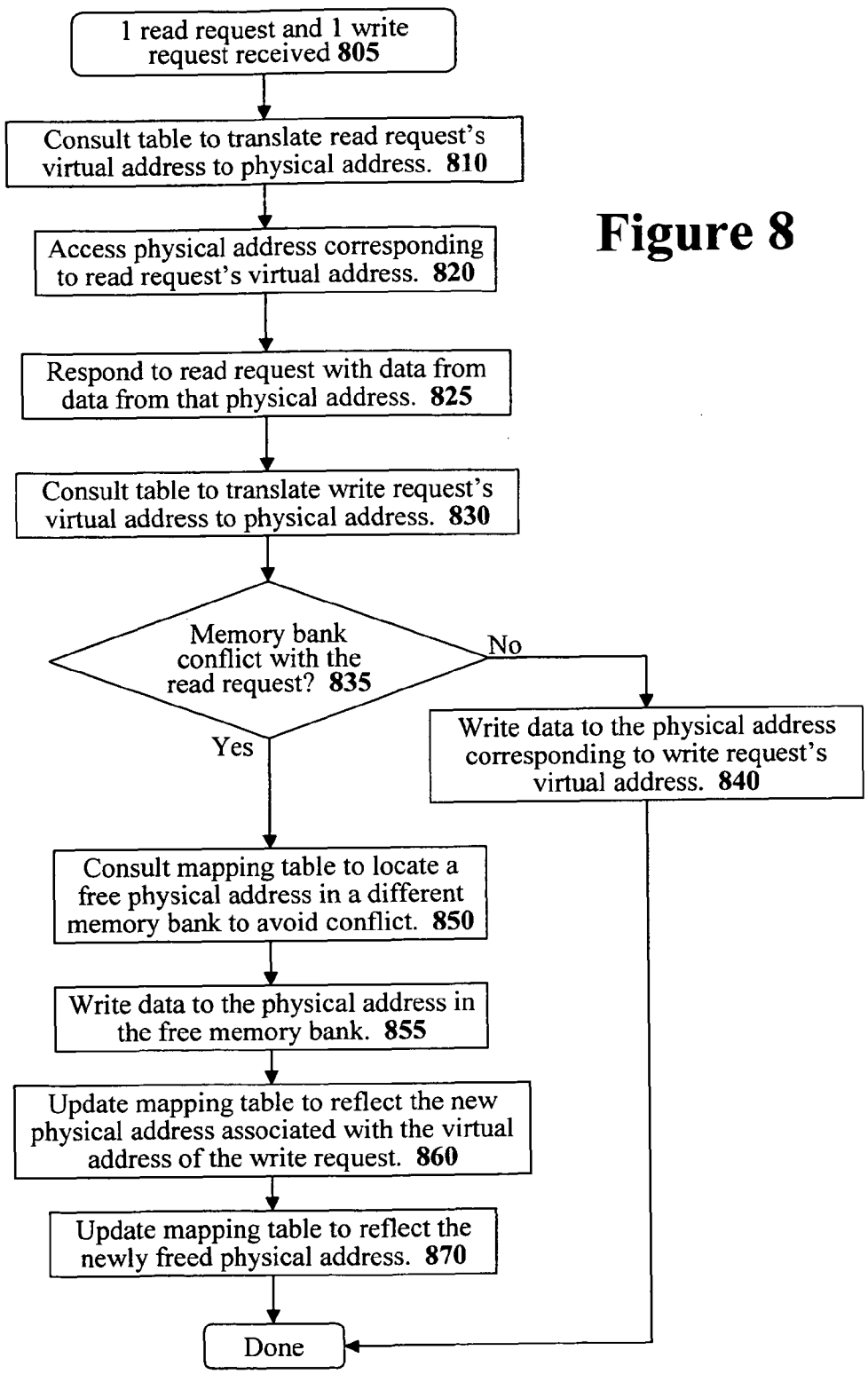
FIG. 8 illustrates a flow diagram describing how the virtualized memory system of FIG. 6A operates.

The full chain of events will be set forth with reference to the flow diagram of FIG. 8. The flow diagram of FIG. 8 is used to explain the system in a simple manner. In a real implementation, some stages (such as the table look-ups in stages 810 and 830) may be performed in parallel.

Initially, at stage 805, the virtualized memory system controller 721 receives the read request (from address 103) and the write request (to address 101). Next, at stage 810, the virtualized memory system controller 721 consults the virtualized memory table 723 to determine the current physical location of virtualized address 103 associated with the read request. The most significant digit is used to select a column and the two least significant digits are used to select a row in virtualized memory table 723 which specify that virtualized address 103 is current located in memory bank B. Thus, the virtualized memory system controller 721 reads that physical location and responds to the read request from address 103 at stage 825. Again, it must be emphasized that these examples are only being presented in decimal form to simplify the explanation and a normal implementation would use binary numbers. Furthermore, many other look-up table designs (such as different address bits associated with the row and columns) may be used to accomplish the same result as the specific virtualized memory table 723 example depicted in FIG. 7A.

At stage 830, the virtualized memory system controller 721 consults the virtualized memory table 723 to determine the physical location of the virtualized address (101 in this example) associated with write request. Consulting virtualized memory table 723, it can be seen that virtualized address 101 is in memory bank B. Next, at stage 835, the system determines if this location causes a memory bank conflict with the read operation. If the write had been to a memory location in a different memory bank (such as address 200 in bank D) then the write could simply be performed using that location in parallel with the read operation at stage 840 and thus completing both memory operations. However, in this example, the write is to virtualized address 101 that is in memory bank B thus causing a memory bank conflict with the read of virtualized address 103 also in memory bank B.

To prevent the memory bank conflict between addresses 101 and 103, the system proceeds to stage 850 where the virtualized memory system controller 721 consults the "e" column of the 01 row in the virtualized memory table 723 to determine the physical location of an available memory bank to write the data for virtualized address 101. Row 01 of column "e" in virtualized memory table 723 specifies memory bank E as being available. Thus, the virtualized memory system controller 721 writes the data from the write request into row 01 of memory bank E. (The actual data value is not shown since the actual data value does not matter for this discussion.)

Since the location of virtualized memory address 101 has moved, the virtualized memory table 723 must be updated to reflect the new physical location of virtualized address 101. Thus at stage 860, the virtualized memory system controller 721 writes "E" into row 01 of the 1 column of the 01 row in the virtualized memory table 723.

Similarly, the new free memory bank associated with the 01 row must be updated. Therefore, at stage 870, the virtualized memory system controller 721 writes "B" into the "e" column of row 01 in the virtualized memory table 723. Note that in implementations where the free memory bank is inferred by the memory bank not listed in 00, 01, 02, or 03 columns of a particular row, this stage does not need to be performed. At this point, both the read operation to address 103 and the write operation to address 101 have been performed without stalling the memory user(s) that issued the memory access requests.

Figure 7D:
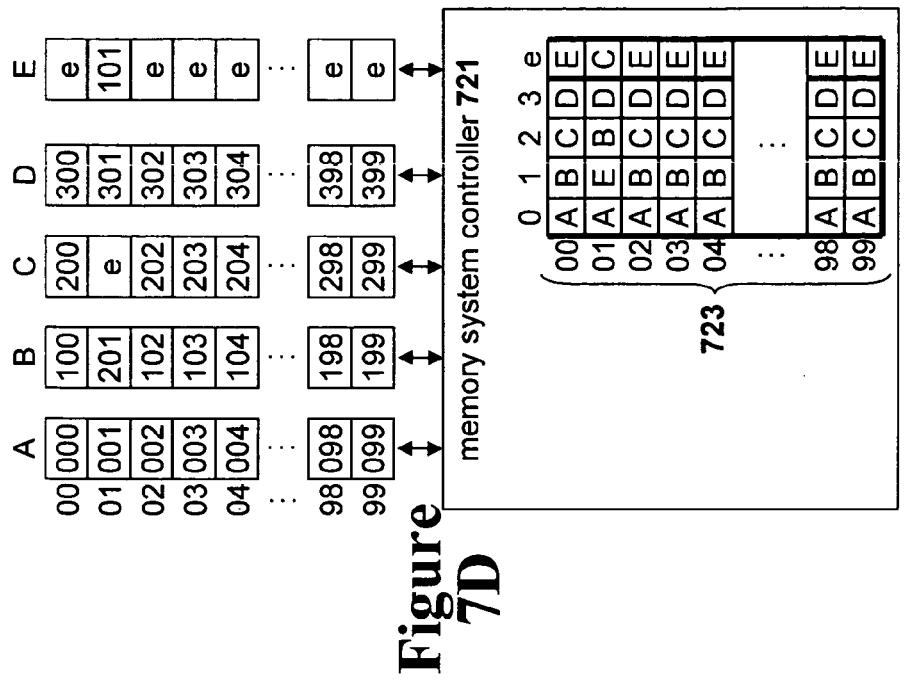
FIG. 7D illustrates the state of the virtualized memory system of FIG. 7C after processing the read and write operations.
Figure 7C:
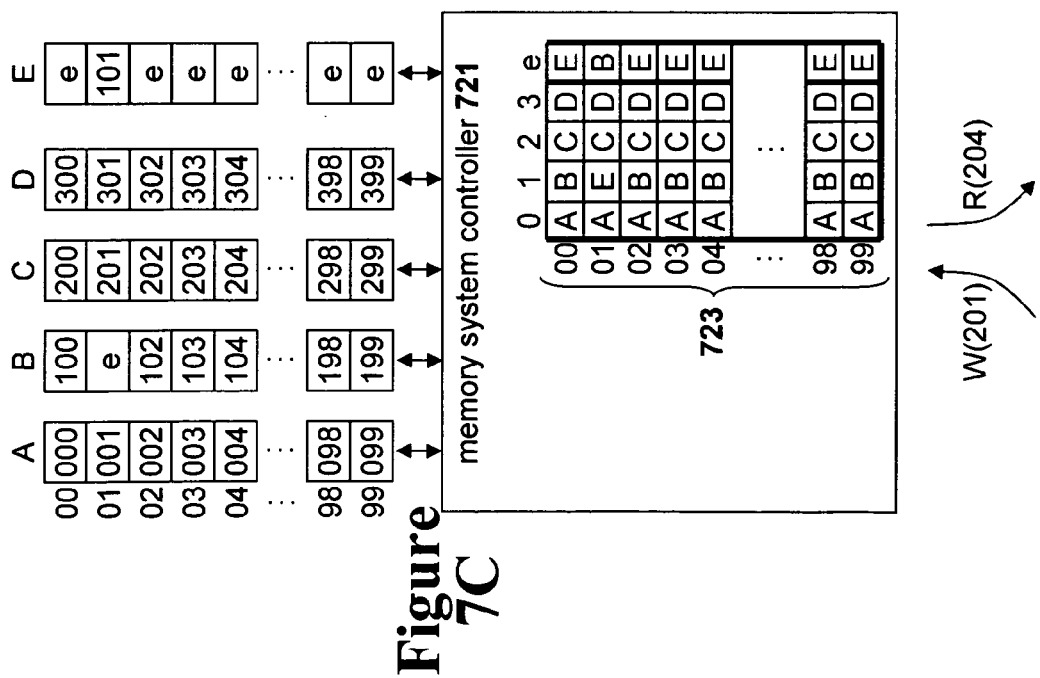
FIG. 7C illustrates the virtualized memory system of FIG. 7B receiving another set of simultaneous read and write operations.

A second example of a simultaneous read operation and write operation is provided with reference to FIGS. 7C and 7D. FIG. 7C uses the state of FIG. 7B as a starting point and then simultaneously receives a write to virtualized address 201 and a read from virtualized address 204. To perform the read of virtualized address 204, the memory controller 721 first determines the location of virtualized address 204 in the physical memory. Thus, the memory controller first reads out the entry at column 2 of row 04 in virtualized address table 723 which specifies that virtualized address 204 is currently located in memory bank C. Thus, the memory controller 721 reads the data for virtualized address 204 out of the 04 row of memory bank C to handle the read request.

To handle the write to virtualized address 201 (which was previously in the 01 row of column C thus causing a memory bank conflict with the read from row 04 of memory bank C), the memory controller 721 reads the entry from the "e" column in row 01 of virtualized address table 723 to determine that the free memory bank for row 01 is memory bank B. Thus, the data associated with the write to location 201 is placed in row 01 of physical memory bank B as depicted in FIG. 7D. The memory controller 721 then updates table 723 to reflect the new location of virtual address 201 (by writing "B" in entry at row 01 of column 2) and the location of the new free memory location for row 01 (by writing a "C" in the entry at "e" column of row 01.

As can be seen from the above two examples, the virtualized memory system will always have at least two locations where it can perform a write for any virtualized address: the current location of that virtualized address or the memory bank for that row designated as empty. If an incoming write does not cause a memory bank conflict with a simultaneous read, then the virtualized memory controller 721 may store the data in its current location. However, if there is a memory bank conflict caused by a read and write to the same memory bank, then the virtualized memory controller 721 will write the data to the memory bank having an empty location for that row and update the new location of that virtualized memory address in the virtualized memory table 723. In the implementation depicted, the lowest two digits of the virtualized address space location will always designate the row in the physical memory space. However, in a real digital implementation, a subset of bits from the virtualized memory address may be used (such as a set of least significant bits of the virtualized memory address).

Multiple Entries in Each Memory and Table Row

Figure 9:
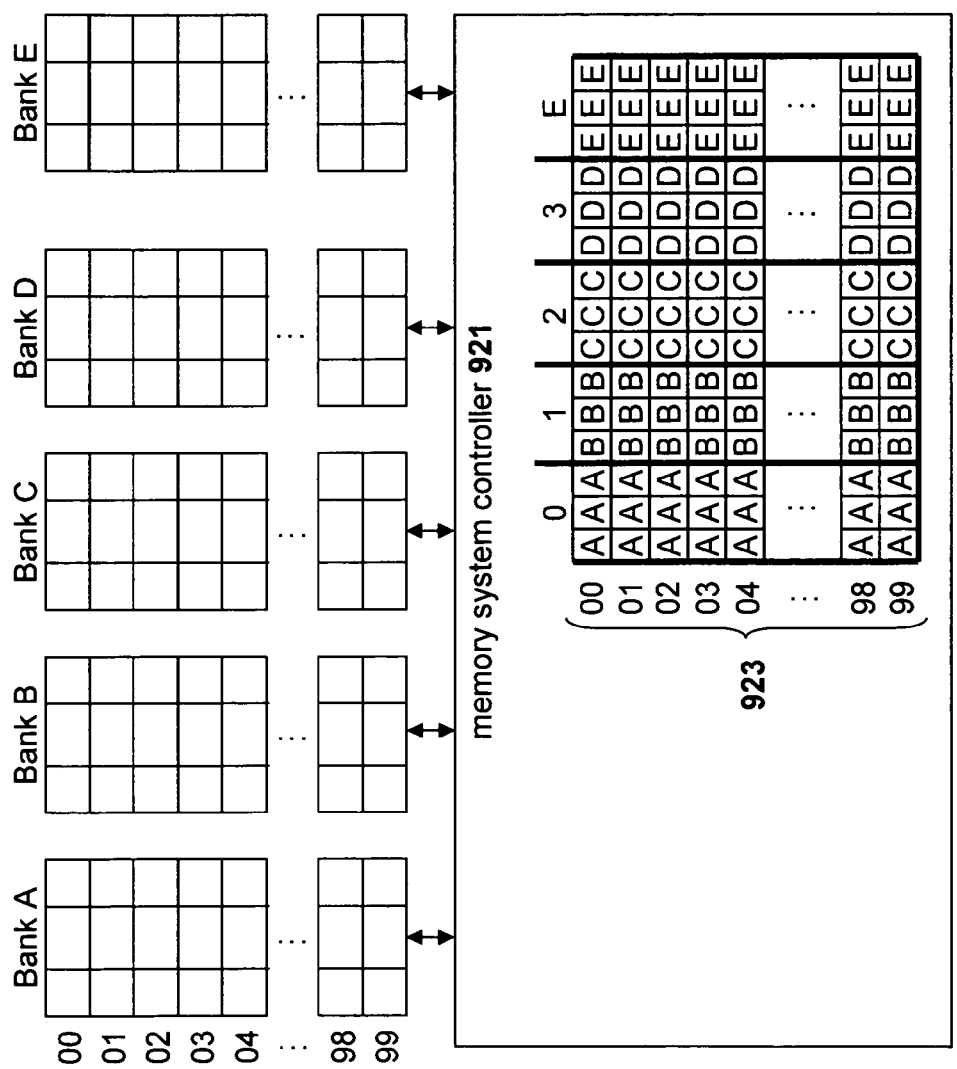
FIG. 9 illustrates another block diagram of an implementation of a virtualized memory system that stores more than one element in each memory row.

In the examples of FIG. 6A and FIGS. 7A to 7D, the rows of each memory bank (and the entries in the corresponding memory table) have been depicted as a single memory location. However, this is not a requirement of the system of the present disclosure. As long as individual columns of each memory bank can be read from and written to independently, each row of each memory bank may contain multiple individual data entries. FIG. 9 illustrates one possible example of such an implementation.

Referring to FIG. 9, each memory bank has been divided into three columns. Each of these columns in each row may represent a different virtual memory address within that same row of the memory bank. Note that additional address bits (not shown) from the virtualized memory address must be used to specify which column in that memory bank row is specifically being addressed. To handle the different columns, the virtualized memory table 923 must also have a corresponding set of columns. In this manner, each individual column can be located, read, and moved as necessary. As illustrated in FIG. 9, there is still a one to one correspondence between addressable physical memory locations in the memory banks and locations in the virtualized memory table 923.

It should be noted that the implementation set forth in FIG. 9 may be advantageous in many implementations. By using memory circuits that read out wide rows of data, and thus have fewer read-out circuits per memory cell, greater memory density can be achieved. Thus, many (if not most) implementations may use the teachings set forth with reference to FIG. 9. Although many implementations may use the teachings set forth with reference to FIG. 9, this document will continue to use diagrams with one entry per memory bank to keep the examples from being unnecessarily complex.

Figure 10:
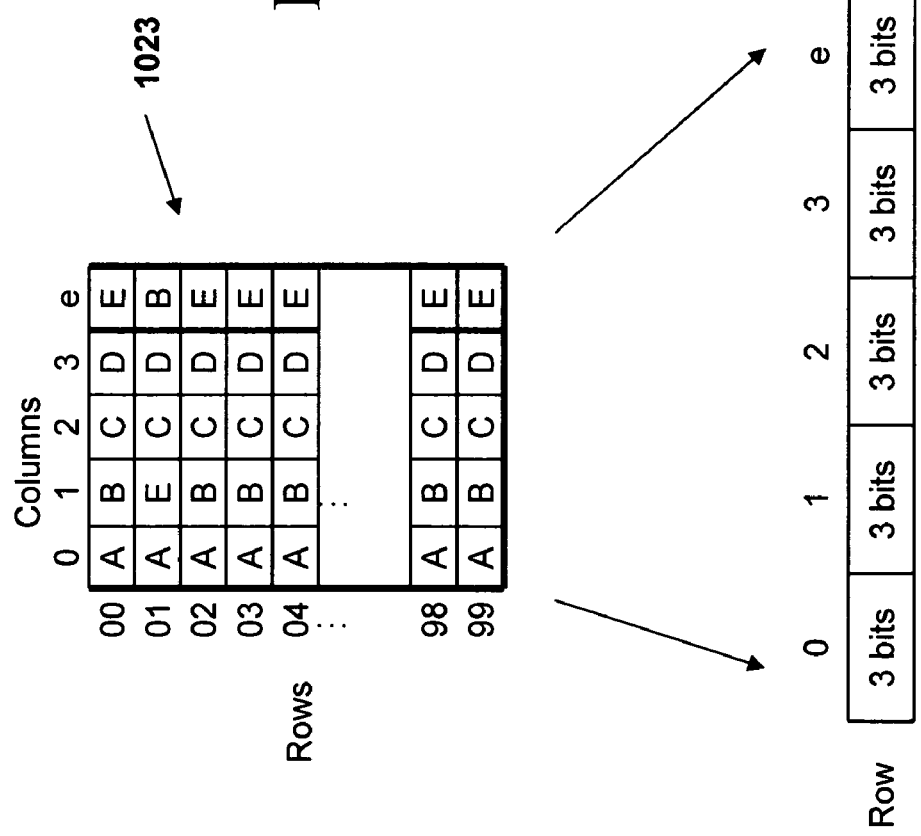
FIG. 10 illustrates an expanded view of a virtualized memory mapping table.

Mapping Table Encodings:

Referring back to FIG. 6A, the virtualized memory system 600 uses a virtualized memory mapping table 623 to translate virtualized memory addresses into physical memory addresses. FIG. 10 illustrates an expanded view of a virtualized memory mapping table 1023. Using a specific virtual memory address as an index into the virtualized memory mapping table 1023, the entry in the virtualized memory mapping table 1023 specifies which memory bank currently stores that particular virtual memory address.

Since there is an entry in the virtualized memory mapping table 1023 for each distinct virtualized address, the size of the virtualized memory mapping table 1023 can become quite large. To help reduce the size of the virtualized memory mapping table 1023, the implementation of FIG. 10 restricts each virtualized memory address to be located in the same row of each memory bank. This allows each table entry to only specify a particular memory bank that contains the virtualized memory address instead of requiring both the row and memory bank if the system allowed any virtualized memory address to be stored in any physical memory address. But even with this restriction, the virtualized memory mapping table 1023 will still be relatively large.

Each entry in the virtualized memory mapping table 1023 must specify which one of five different memory banks (A, B, C, D, or E) stores a particular virtualized memory address. To store one of five different states, three bits are normally required as illustrated in the example row 1050 in FIG. 10. However, this is wasteful since three bits can actually store eight different possible states. It would therefore be desirable to improve the efficiency of the storage system to reduce the size of the virtualized memory mapping table 1023.

Figure 11B:
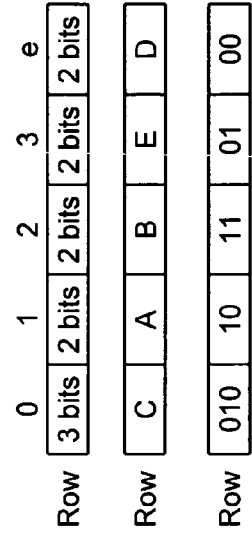
FIG. 11B illustrates an example encoding of a memory mapping table row using the set pattern of FIG. 11A.
Figure 11D:
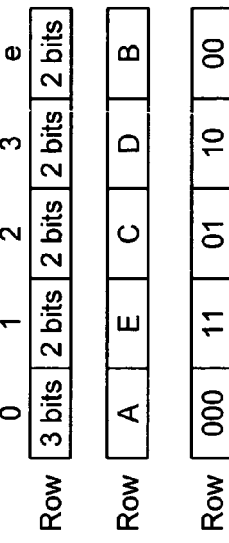
FIG. 11D illustrates an example encoding of a memory mapping table row using the set pattern of FIG. 11C.
Figure 11A:
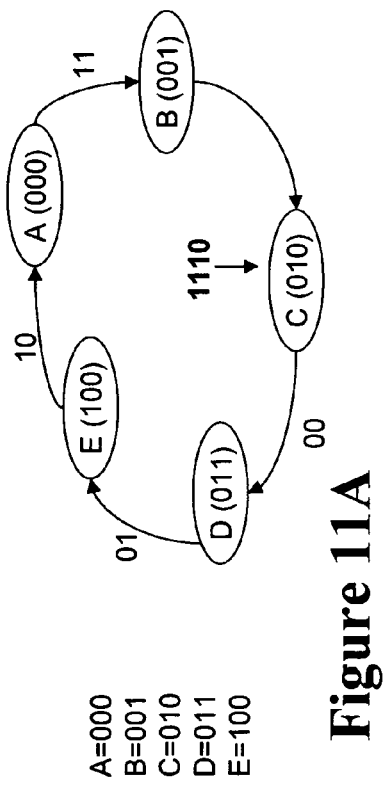
FIG. 11A illustrates a set pattern for establishing relationships in an encoded memory mapping table.

FIGS. 11A and 11B illustrate an encoding method that may be used to reduce the size of each row in the virtualized memory mapping table 1023. In the disclosed encoding method, each memory bank is assigned a unique three-bit encodings as set forth in the left portion of FIG. 11A wherein memory bank A is identified with 000, memory bank B is identified with 001, and so on. This three-bit encoding system is used to specify the memory bank in the first column of the virtualized memory mapping table 1023. This is illustrated in FIG. 11B wherein the "0" column contains a three-bit value.

The four remaining columns are then encoded with a two-bit value which specifies an offset from the value in the first column according to a set relation pattern. The right portion of FIG. 11A illustrates one example relationship pattern between the various memory banks. In the example relationship of FIG. 11A, one position clockwise from the position identified in the first column is encoded as "00", two positions clockwise from the position identified in the first column is encoded as "01", and so on. Note that each encoding is the binary value of the number of positions away minus one.

Figure 11C:
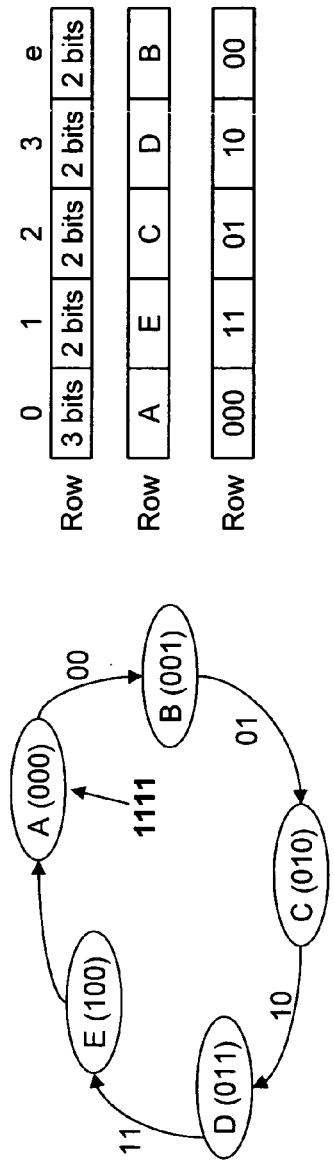
FIG. 11C illustrates a set pattern for establishing relationships in an encoded memory mapping table.

An example is set forth in FIG. 11B. The second row of FIG. 11B illustrates an example pattern of C, A, B, E, D in a table row. To encode this, the first column is identified with the encoding for C which is 010 as specified by position 1110 in the pattern of FIG. 11A. The remaining positions are then encoded with their relative position from the C position 1110 in the pattern of FIG. 11A. The second column specifies bank A such that 10 is encoded in the second position since it is three positions along the clockwise pattern away from the C encoding. Next, the third column specifies bank B which is four positions from C in the pattern of FIG. 11A such it is encoded as '11'. The next two columns are encoded in the same manner. FIGS. 11C and 11D illustrate a second example wherein a mapping table row containing A, E, C, D, B is encoded.

The encoding system set forth in FIGS. 11A to 11D reduced the size of each row in the virtualized memory mapping table from 15 bits to 11 bits thereby reducing the size of the overall virtualized memory mapping table. In a real implementation wherein the virtualized memory mapping table would be much larger, this is an important reduction to the size of the large virtualized memory mapping table.

However, the virtualized memory mapping table can still be encoded even more efficiently. Note that each row will only contain once instance of each different memory bank. Once a particular memory bank value has been encoded, that memory bank will not appear again in the same row. This can be used to further reduce the size of the virtualized memory mapping table. Specifically, the number of bits required to encode the remaining entries in a row is equal to the number of bits required to encode the number of remaining entries. An example is provided with reference to FIGS. 12A and 12B.

Figure 12B:
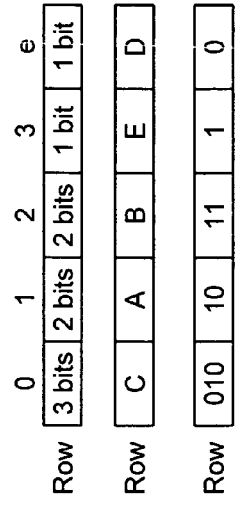
FIG. 12B illustrates an example encoding of a memory mapping table row using the set pattern of FIG. 12A.
Figure 12D:
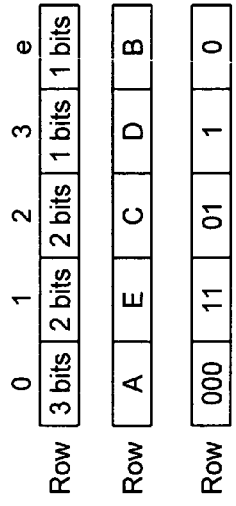
FIG. 12D illustrates an example encoding of a memory mapping table row using the set pattern of FIG. 12C.
Figure 12A:
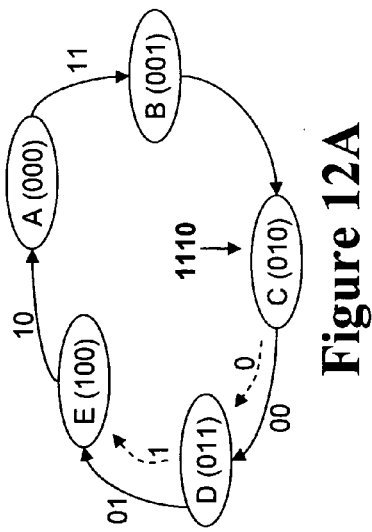
FIG. 12A illustrates a set pattern for establishing relationships in an encoded memory mapping table.

Initially, there are five entries that must be encoded. Since three bits are required to encode five different states, the first entry is encoded with three bits as set forth in the previous example. In the example of FIG. 12B, the first entry specifying bank C is encoded as 010. There are now four remaining entries to encode and since only two bits are required to encode four different states, two bits will be used to encode the second entry. Again, the same manner used in the previous example is used to encode the second entry. The second entry specifies bank A which is three positions away from the C position the relationship pattern of FIG. 12A such at "10" is used to encode bank A in the second entry. There are now three remaining entries to encode and since two bits are required to encode three different states, two bits will be used to encode the third entry. Again, the same manner used in the previous example is used to encode the third entry. The third entry specifies bank B which is four positions away from the C position the relationship pattern of FIG. 12A such that "11" is used to encode the third entry.

There are now only two remaining entries to encode in the table and since only one bit is required to encode two different states, only one bit will be used to encode the fourth entry. To encode the fourth entry, the number of positions along the pattern of FIG. 12A from the first entry when only considering the remaining values to be encoded is used. In this example, only E and D remain to be encoded since C, A, and B have already been encoded. Since the fourth position specifies bank E and bank E is two positions from the C position in FIG. 12A when only considering the remaining D and E positions, the fourth entry is encoded as "1".

Figure 12C:
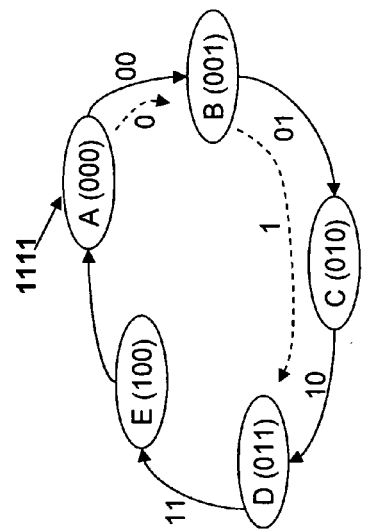
FIG. 12C illustrates a set pattern for establishing relationships in an encoded memory mapping table.

Finally, there is only one remaining position to be encoded. Technically, no bits are required to encode the final position since there is only one possible entry. And, as stated earlier, some implementations may not have the final column since its value can be inferred. However, in the implementation of FIG. 12B, the fifth (final) position is encoded in the same manner of the fourth position. Since the fifth position specifies bank D that is only one positions from the C position in FIG. 12A when only considering the remaining D and E positions, the fourth entry is encoded as "0". A second example of encoding a row according to this method is provided in FIGS. 12C and 12D.

Figure 12E:
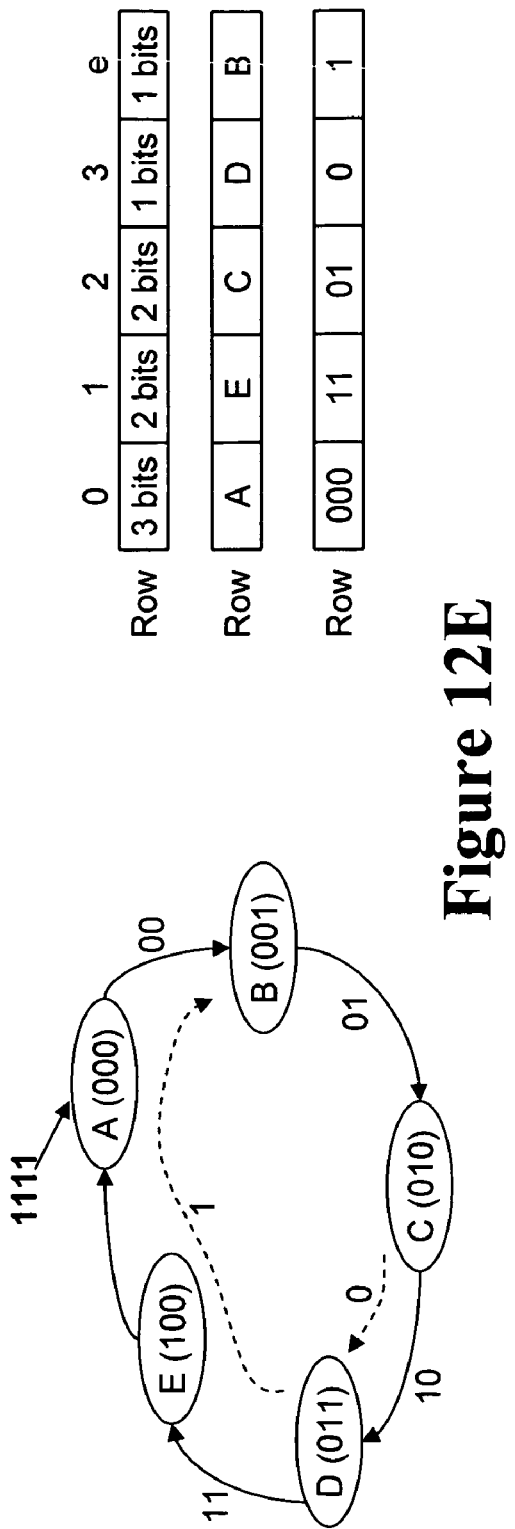
FIG. 12E illustrates an alternate example encoding of the row pattern of FIGS. 12C and 12D.

Instead of making an encoding position relative to the entry in the very first entry of a row, each entry may be made relative to the last earlier entry encoded with a greater number of bits. FIG. 12E illustrates such an embodiment. In the example of FIG. 12E, three bits are used to implement the first entry specifying memory bank A. The next two entries use two bits and are made relative to that first entry encoded with three bits. Thus, the second and third entries are encoded as 11 and 01 identifying the number of positions relative to the A position of banks E and C, respectively. The next two entries are encoded with one bit and may be made relatively to the last position encoded with two bits, the third entry specifying bank C. Thus, the fourth entry encodes memory bank with a "0" since D is only one position (when only considering the remaining values of D and B) away from the C entry. Finally, the last entry contains a "1" since the B position is two positions away from the C position when only considering the remaining values of D and B.

In a very large virtualized memory mapping table, the encoding system set forth in FIGS. 12A to 12E greatly reduces the size of the virtualized memory mapping table. However, this reduced virtualized memory mapping table size comes at the cost of more complicated logic for encoding and decoding the entries in the virtualized memory mapping table. But with the very large virtualized memory mapping tables that would be used in many real implementations, the die area used to implement the encoding and decoding logic is much smaller than the amount of die are saved by reducing the virtualized memory mapping table size with this encoding scheme.

Mapping Table Implementations

High-speed logic and memory can be used to implement the virtualized memory mapping table used in the virtualized memory system of the present disclosure. Specifically, as set forth in the flow diagram of FIG. 8, the virtualized memory mapping table must be accessed at stages 810, 830, 850, 860, and 870. Many techniques can be used to reduce the number of times that the virtualized memory table is actually accessed and to increase the performance of the virtualized memory table. This section will disclose several methods that may be used to implement the virtualized memory table.

Referring back to FIG. 8, the virtualized memory controller will consult the virtualized memory table at stage 830 to determine the current memory bank of a virtualized memory address that a write operation is accessing. If the virtualized memory address associated with the write operation is in the same memory bank that the read operation accessed back in stage 820, then a memory bank conflict has been detected such that the virtualized memory controller must then access the mapping table in stage 850 to determine the free memory bank for that same physical memory row. Referring back to the virtualized memory table 623 of FIG. 6A, it can be seen that the free memory bank is located in the same row of the virtualized memory table 623 as the entry that was just read to locate the current memory bank of the virtualized address being written to. For example, if the system is writing to virtualized address 302 then the system must read the entry at the 3 column of row 02 to identify the memory bank storing address 302. If a conflict occurs, the system needs to obtain the entry from the 'e' column of row 02 to identify the free memory bank. Therefore, the system can obtain both the memory bank virtual address being written to and the free memory bank for that row simultaneously by reading out the entire row of the virtualized memory table 623 at stage 830.

Similarly, the updates to the virtualized memory table 623 performed at stages 860 and 870 can be performed with a similar single access. Specifically, the entire row that was read out at stage 820 (in the improved parallelized version) is updated and then the entire row written back to the virtualized memory table 623 containing both the new location of the moved virtualized address due to the write and the new location of the free memory bank. Thus, the updates of stages 860 and 870 are performed with a single write operating to the virtualized memory table 623.

Figure 13A:
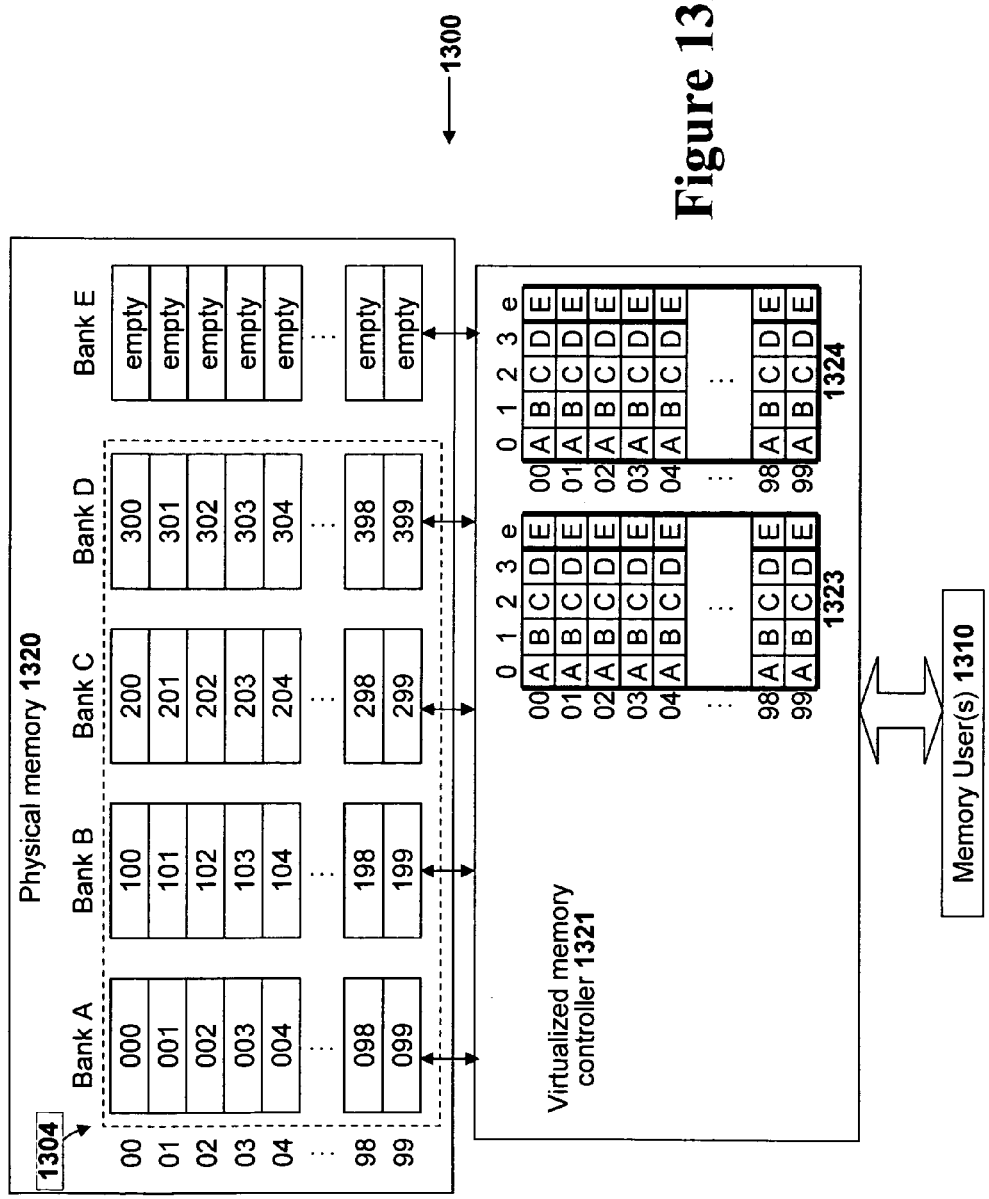
FIG. 13A illustrates a virtualized memory system containing a duplicated virtualized memory table for speed improvement.

With the previous two combinations of read and write operations by reading and writing an entire row from the virtualized memory table 623, the number of accesses has been reduced down to three: the read for the read virtualized address at stage 810, the combined read for the physical addresses of the write's virtualized address and free bank (stages 830 and 850), and the combined write of the updated physical addresses associated with the virtualized address of the write operation and free bank (stages 860 and 870). This is two read operations and one write operation to the virtualized memory mapping table. By implementing two identical copies of the virtualized memory table, the two reads can be performed in parallel and the single write operation can be performed to both copies of the virtualized memory table. Thus, FIG. 13A illustrates a virtualized memory system 1300 containing two virtualized memory tables (virtualized memory table 1323 and virtualized memory table 1323). In such a system, there are only two accesses to the virtualized memory table for each memory cycle such that the virtualized memory table only needs to be twice as fast as the physical main memory 1320. Specifically, there is a single read operation (which is actually two reads in parallel) and a single write operation.

After all of these optimizations, one final implementation can be used to further increase the speed of virtualized memory table. The virtualized memory table itself can be implemented using the techniques of the present invention. Thus, the techniques of the present disclosure may be used in a recursive manner.

As set forth earlier, there is only a single read and a single write operation to the virtualized memory table. These two operations cannot be performed in parallel since the write is dependent on the read. However, in a pipelined implementation wherein multiple different memory access requests are being processed simultaneously at various different stages, the write from an earlier memory access may be combined with the read for a subsequent memory access. Thus, a single read and write need to be performed simultaneously. This is exactly the problem solved as set forth in FIGS. 7A to 7D. Thus, the very same techniques to build the virtualized memory system 1300 illustrated in FIG. 13A can be used in a recursive manner to build the virtualized memory tables 1323 and 1324 in that virtualized memory system 1300. In this manner, the memory technology used to implement the virtualized memory tables 1323 and 1324 can operate at the same speed as the memory technology used to implement the main physical memory 1320.

Figure 13B:
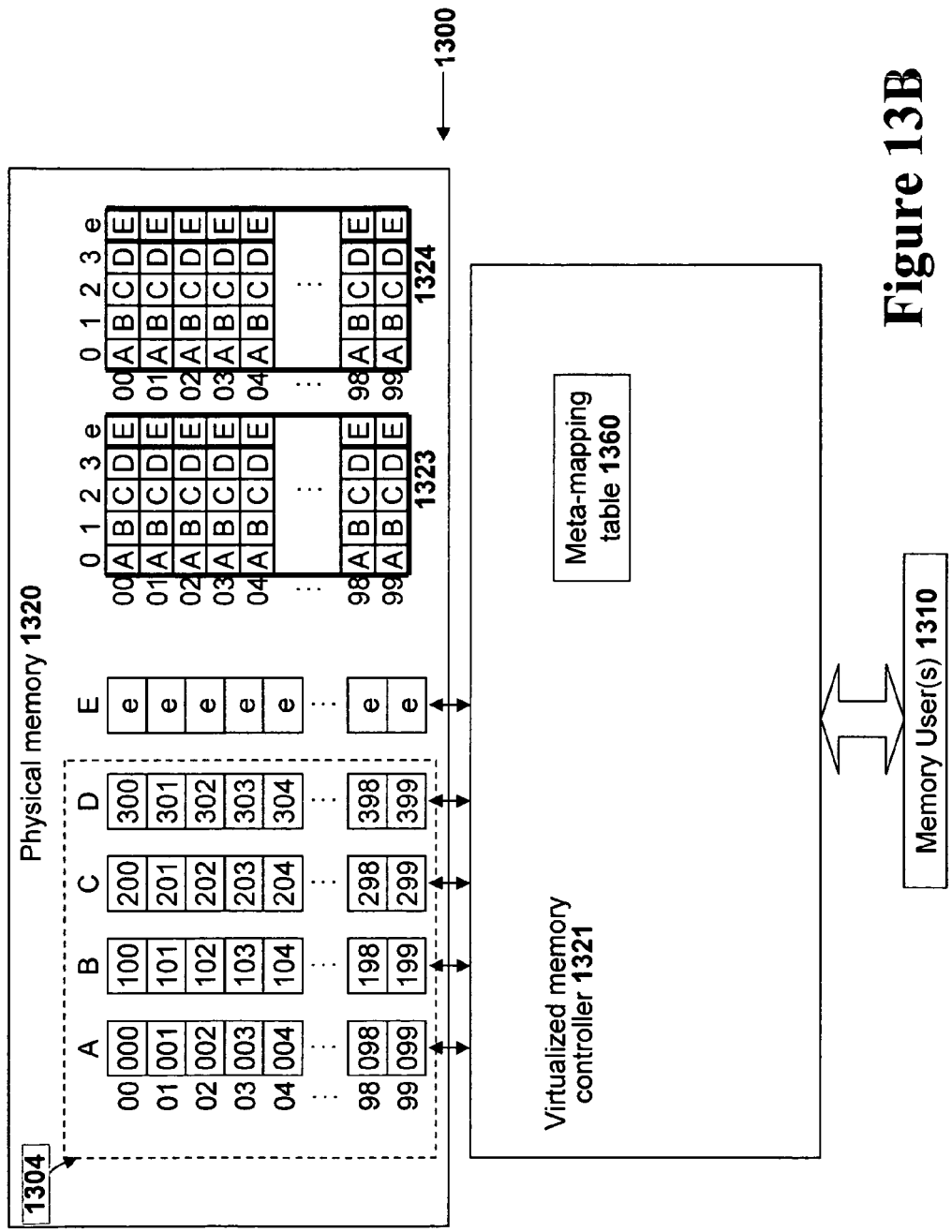
FIG. 13B illustrates virtualized mapping tables are implemented within the same physical memory system as the rest of the memory banks used to normal storage.

Since the same type of memory technology can be used to implement the virtualized memory mapping tables as the physical memory, the virtualized memory mapping tables can actually be integrated into the physical memory. An example of this is presented in the conceptual diagram of FIG. 13B. In FIG. 13B, the virtualized mapping tables are implemented within the same physical memory system 1320 as the rest of the memory banks used to normal storage. In such an implementation, a small high-speed meta-mapping table 1360 will be required within the virtualized memory controller 1321, however, this high-speed meta-mapping table 1360 will be much smaller than the main virtualized memory mapping tables 1323 and 1324.

Figure 13C:
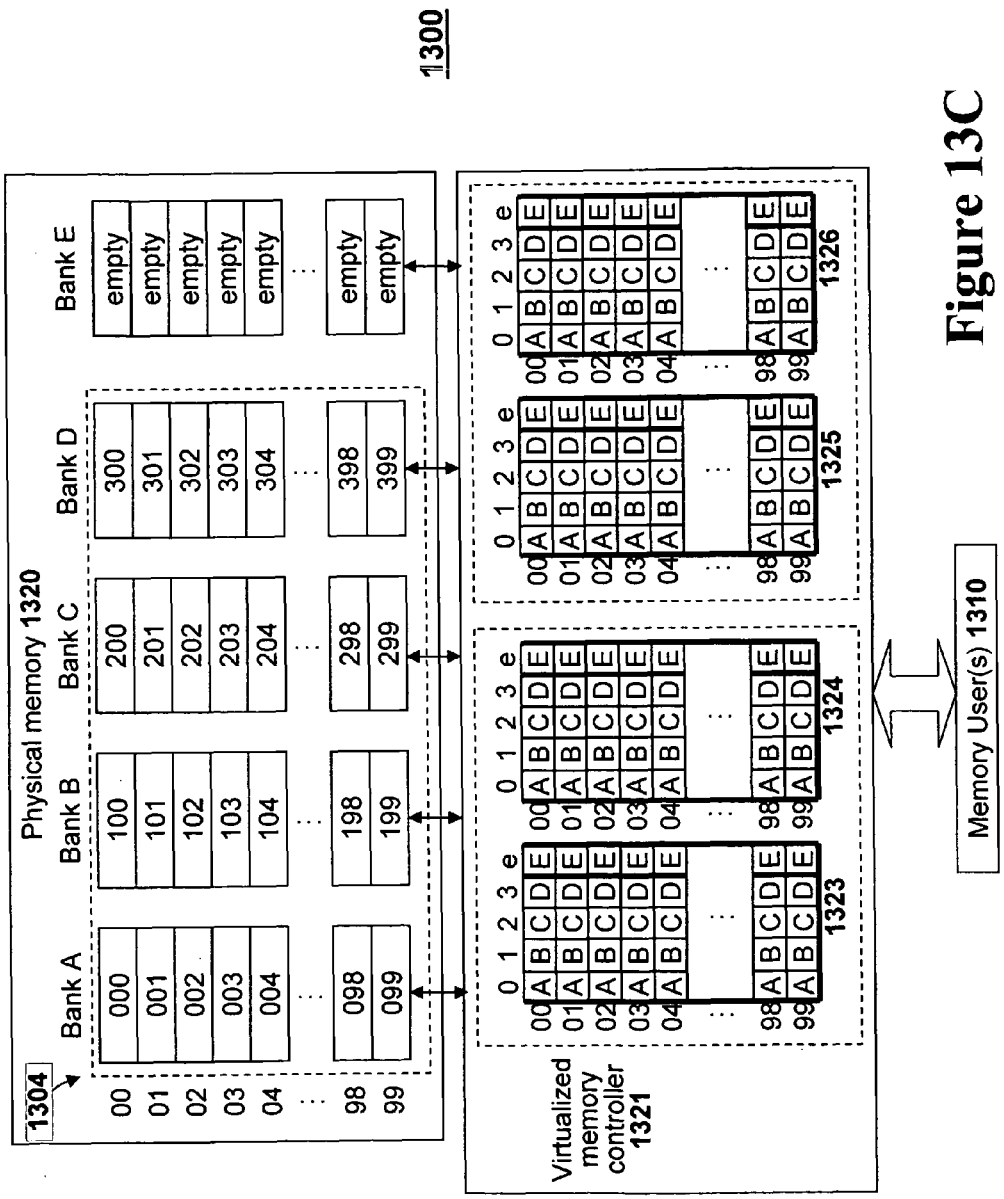
FIG. 13C illustrates a virtualized memory system containing two different sets of duplicated virtualized memory tables that operate in a ping-pong manner.

Referring back to FIG. 13A, the duplicated memory mapping tables (1323 and 1324) may be duplicated again and arranged in a "ping-pong" configuration. An example of such an embodiment is illustrated in FIG. 13C. In the memory system 1300, a second set of duplicated memory mapping tables (1325 and 1326) is added to the virtualized memory controller 3121. In a ping-pong configuration, the system alternates in writing between the two different memory systems such that while one memory system is completing a memory write, the other memory system is available to take in new data.

Various different memory technologies may be used to implement various different parts of the disclosed virtualized memory system. In one embodiment, standard DRAMs may be used for the main physical memory of the system. In another embodiment, embedded DRAM may be used as the main physical memory system.

Embedded DRAM (eDRAM) is particularly advantageous for the recursive implementation illustrated in FIG. 13B wherein the virtualized memory address mapping table is stored in the same physical memory (eDRAM) as the main data storage since the logic for implementing the virtualized memory controller 1321 can be on the same die as the virtualized memory address mapping table.

The various techniques used to speed up the virtualized memory mapping table will increase the memory size of the virtualized memory mapping table. For example, creating duplicate tables doubles the size of memory needed. And implementing the system in a pipelined manner at least doubles the size again. However, this increase in the size of memory needed may be made up for due to the fact that high-speed SRAM may require four to six times as much die area per bit when compared with embedded DRAM. In addition, the yield rates for SRAM circuits often tends to be lower than the yield rates for embedded DRAM such that it is often desirable to use embedded DRAM instead of SRAM when possible such that more operational chips are manufactured.

Digital semiconductor designers often work using a set of pre-defined libraries of digital circuits in order to minimize risk and reduce development time. These libraries of digital circuits include a wide variety of circuits for performing various commonly needed functions. For example, there are library circuits for memory arrays, processor cores, digital protocol stacks, standardized digital input/output systems, and many other functions. Digital circuits that implement techniques of the present disclosure may be added to such digital circuit libraries. One very useful example would be to create an entry in a digital circuit library for an embedded DRAM device (eDRAM) that includes the implements the techniques of the present disclosure. Such a digital circuit library entry would provide an improved memory system to integrated circuit designers in a completely transparent manner. The digital circuit library entry would appear similar to existing eDRAM circuit entries except that it would use more die area and provide much better memory performance.

Various techniques may be used to implement the memory portions of the system that must operate at very high speed. High-speed SRAM can be used as the basic technology for high-speed sections that require memory. For additional speed in implementing memory sections such as the meta-mapping table 1360 of FIG. 13B, over-clocked SRAM may be used. Over-clocked SRAM is traditional SRAM implemented in a small area such that the shorter conductors allow the SRAM to operate at higher clock rates. Individual flip-flop circuits may also be used in the sections that require very high-speed memory services.

Single Read, Multiple Writes Simultaneously:

The virtualized memory system set forth in the previous sections can be expanded to handle more than one memory write operation along with a single simultaneous read operation. In order to handle additional write operations, there only needs to be an additional memory bank for each additional write operation that will occur simultaneously with the memory read operation since each additional memory bank can avoid a potential memory back conflict. For example, to handle two write operations and one read operation simultaneously, two additional memory banks are required as illustrated in the embodiment of FIG. 14A.

Figure 14B:
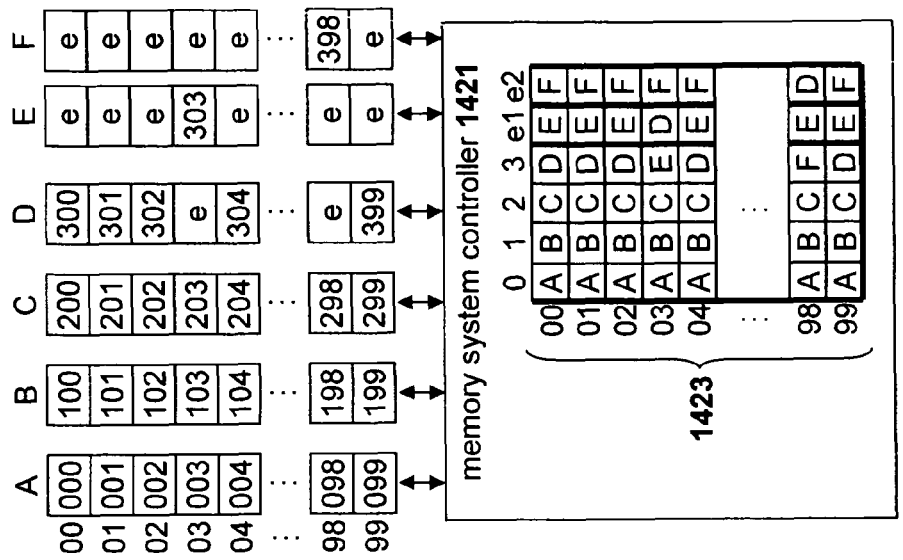
FIG. 14B illustrates the virtualized memory of FIG. 14A after handing a read and two simultaneous write operations.
Figure 14A:
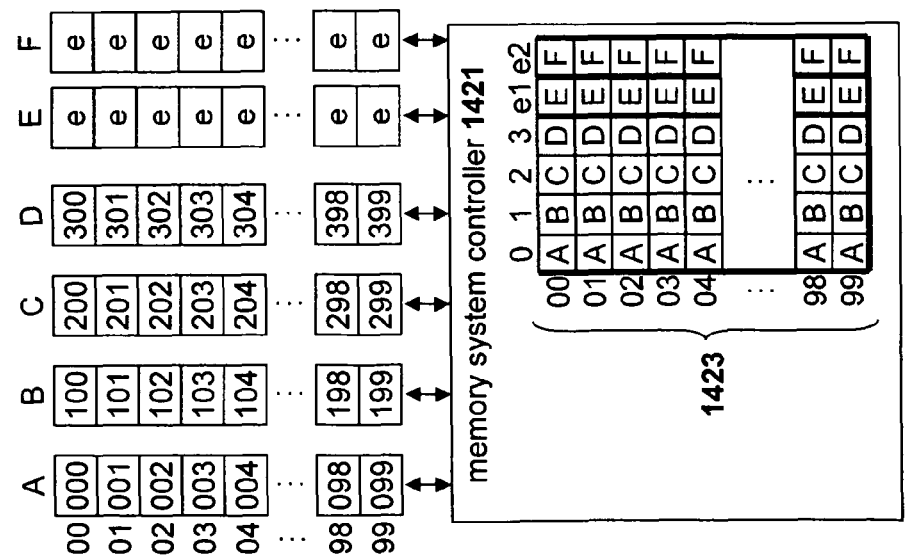
FIG. 14A illustrates an initial state of a virtualized memory system that handles one read and two write operations simultaneously

FIG. 14A illustrates one possible initial state for a virtualized memory system that can simultaneously handle one read operation and two write operations. As set forth in the previous sections, if the memory access requests all access different memory banks then there is no memory bank conflict since all the memory operations may be handled independently by each independent memory bank. However, in the memory access example of FIG. 14A, three memory operations accessing virtualized memory addresses in the same memory bank (memory bank D) are received: a read from virtualized address 301, a write to virtualized address 303, and a write to virtualized address 398.

To handle the read from virtualized address 301, the memory system controller 1421 accesses the virtualized memory table 1423 and reads the entry in the 3 column of row 01 to discover that virtualized address 301 is currently stored in memory bank D. Thus, the memory system controller 1421 accesses row 01 of memory bank D to obtain the data associated with virtualized address 301 and respond to the read request. Since memory bank D is busy handling this memory read from virtualized address 301, the write operations must be handled with different memory banks to prevent a memory bank conflict.

To determine which memory banks (other than busy memory bank D) are free to handle the write operations, the memory system controller 1421 accesses the virtualized memory table 1423 and reads the entries in the e1 and e2 columns (empty 1 and empty 2) for the rows corresponding to the write operations. Thus, the memory system controller will read the entries for columns e1 and e1 from both rows 03 and 98. In this case, both rows report that memory banks E and F have an empty memory bank for rows 03 and 98. The memory system controller 1421 then stores the data from the memory write operations into those memory banks that were designated as available. Note that since both row 03 and row 98 reported memory banks E and F as being available, the memory system controller 1421 must coordinate the writes in a manner that avoids another memory bank conflict. Thus, one of the write operations will use memory bank E and the other write operation will use memory bank F. In this particular example, the write to virtualized address 303 is written to memory bank E and the write to virtualized address 398 is written to memory bank F. The virtualized memory table 1423 must then be updated to reflect the new physical memory locations for virtualized addresses 303 and 398 (banks E and F, respectively) and the new empty memory banks for row 03 and 98 (memory bank D for both rows). The final state after the read operation to address 301 and the write operations to addresses 303 and 398 is illustrated in FIG. 14B.

Another example of a read operation and two write operations is illustrated in FIGS. 14C and 14D. FIG. 14C uses the state of FIG. 14B as a starting point and receives a read operation addressed to virtualized address 200, a write operation to virtualized address 203, and another write operation to virtualized address 299. The system operates in the same manner and the final state is illustrated in FIG. 14D. In this case the write to virtualized address 203 had banks D and F available and the write to virtualized address 299 had banks E and F available. In this case, the memory system controller 1421 stored the data for the write to virtualized address 203 in row 03 of bank D and stored the data for the write to virtualized address 299 in row 99 of column E.

Additional simultaneous write operations can be handled by adding additional memory banks to the physical memory to avoid potential memory bank conflicts. However, the number of accesses to the virtualized memory table 1423 (to determine the where the data being read currently resides and to locate free memory banks for write operations) will eventually become very numerous such that virtualized memory table 1423 will become overloaded. The various memory techniques set forth in the previous section can be used to increase the performance of the virtualized memory table 1423 such that the virtualized memory table 1423 can handle the requirements.

Even Multiple Asymmetric Memory Performance Gains

Different memory technologies have various different artifacts. The system of the present disclosure can take advantage of such memory artifacts and use the memory in the most efficient manner. For example, some memory systems can perform read operations twice as fast as write operations. This may be due to the fact that a write operation may cause a DRAM memory device to read out an entire memory row from a memory matrix, place the new data in the row, and then write back that row to a memory matrix whereas a read operation only reads out a row and then responds with the requested data. Memory devices that have appreciably different time requirements for read operations and write operations may be referred to as "asymmetric memory devices" since the reads and the writes do not have equal time requirements. The memory system techniques of the present disclosure can take advantage of this artifact of asymmetric memory devices.

Figure 15A:
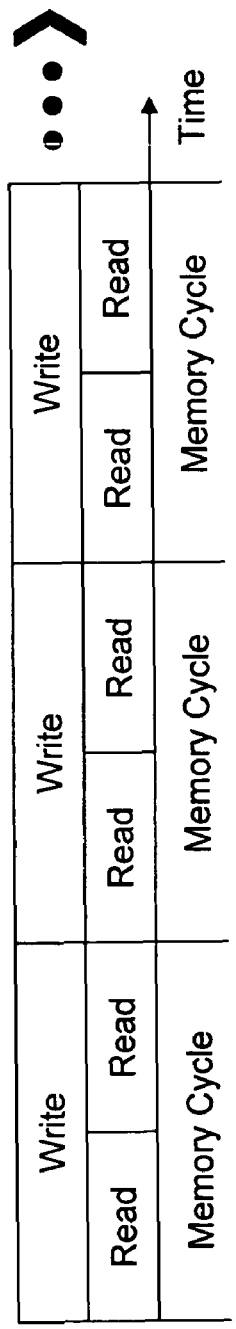
FIG. 15A illustrates a timing diagram for a virtualized memory system that handles a simultaneous read and write operation and takes advantage of asymmetric memory operations where read operations that take half as much time as write operations.

Referring back to FIGS. 7A to 7D, with the teachings of the present disclosure, the addition of a single memory bank to a memory system will allow the memory system to handle a single read operation and a single write operation simultaneously in a manner that prevents any memory bank conflicts from adversely affecting the performance of the memory system. However, when a write operation takes twice as long to complete as a read operation, the same techniques can be used to perform two read operations and one write operation during the time of a single write operation cycle. FIG. 15A illustrates a timing diagram that illustrates how such a memory system operates.

Referring to FIG. 15A, a series of memory cycles are defined along a timeline as the time required to perform a single write operation. When a read operations only requires half the time (or less) of a write operation, then two read operations can be performed consecutively while a single write operation is performed. Not that the two read operations cannot conflict with each other since the two read operations are performed sequentially. While the two consecutive read operations are occurring, a single write operation may be performed simultaneously. In order to avoid any memory bank conflicts with the two read operations, there must be at least three different locations wherein the write operation can write data into. Thus, such an asymmetric implementation will require two extra memory banks since this allows the write to occur to its existing location (if there are no memory bank conflicts with either write operation), to a first free bank (if there is a memory bank conflict with one of the read operations), or to a second free memory bank (if there are memory bank conflicts with both read operations).

Figure 15B:
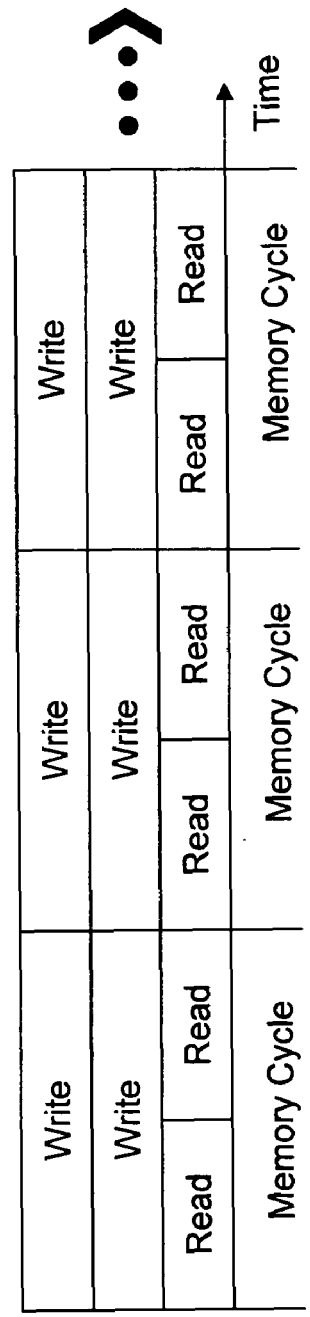
FIG. 15B illustrates a timing diagram for the virtualized memory system of FIG. 15A that handles an additional second write operation.

The technique of adding more memory banks can be used to allow additional concurrent write operations. FIG. 15B illustrates a timing diagram wherein two write operations that take at least twice as long as a read operation are performed at the same time as two sequential read operations. The two reads, two writes system of FIG. 15B requires three extra memory banks.

These techniques can also be applied to non volatiles flash memory. Flash memory has a very asymmetrical profile since writes can take up to ten times as long as read operations. Thus, several reads may be handled while a single write operation is being handled.

Non-Even Multiple Asymmetric Memory Performance Gains

Some memory systems will not have such an even difference between read times and write times. For example, in one memory system a read may require 2 nanoseconds and a write may require 3 nanoseconds. The least common multiple of those two time values (6 nanoseconds) can be used to create memory cycle that will have a whole number of read and write operations.

Figure 15C:
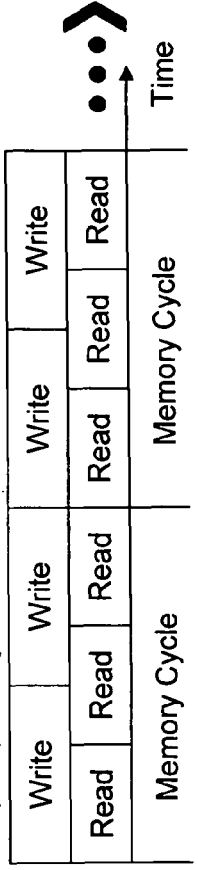
FIG. 15C illustrates a timing diagram for a virtualized memory system that handles simultaneous read and write operations and takes advantage of asymmetric memory operations that are non even multiples of each other.

Using the above example of 2 nanosecond read times and 3 nanosecond write times, the least common multiple is 6 nanoseconds. By defining a memory cycle to be 6 nanoseconds then three read operations and two write operations can be performed during that memory cycle. FIG. 15C illustrates one possible memory cycle timing diagram of such a system. For the particular system of FIG. 15C, two extra memory banks are required. Specifically, the first write must have three different possible locations since it may conflict with the overlapping first and second read operations. Similarly, the second write operation needs three possible locations it can write to since the second write operation may conflict with the overlapping second and third read operations.

Figure 15D:
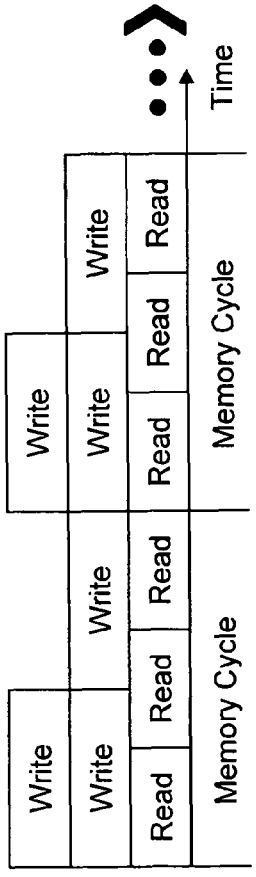
FIG. 15D illustrates the timing diagram of FIG. 15C wherein an extra write operation is handled by adding another extra memory bank.

As in the previous implementations, additional write operations can be added by providing an additional memory banks as required. If a third write operation is added to the system of FIG. 15C then one additional memory bank will be required. A timing diagram for such a system is set forth in FIG. 15D. The third write operation needs three extra memory banks since it may conflict with the first read operation, the second read operation, or the first write operation.

Figure 15E:
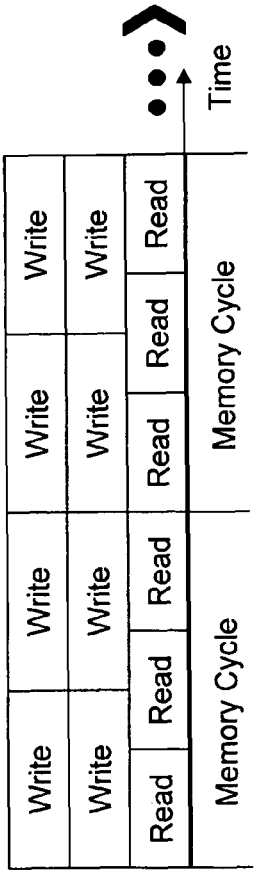
FIG. 15E illustrates the timing diagram of FIG. 15D wherein an extra write operation is handled without needing another extra memory bank.

An extra memory bank will not always be required for an additional write operation. For example, FIG. 15E illustrates the timing diagram of FIG. 15D with a fourth read operation added to the system. The fourth read operation can occur sequentially after the third read operation. Thus, both the third and fourth write operations each only overlap with two read operations and one other write operation. Thus, no additional memory bank is required when adding another write operation to the system of FIG. 15D.

Write Operations Following Read Operations

If memory is a more scarce resource than performance, then the need for additional memory banks can be reduced by having some write operations occur sequentially after read operations. For example, if both read operations and write operations require 2 nanoseconds each, then a system can be constructed with a 6 nanosecond memory cycle that can perform two read operations and two write operations during that 6 nanosecond memory cycle with only one extra memory bank needed. Thus, in exchange for reduced performance, there are reduced hardware requirements since only one extra memory bank was required in order to implement two memory reads and two memory writes in a single (extended) memory cycle. The timing diagram for such a system is illustrated in FIG. 15F.

As illustrated in FIG. 15F, only one write operation overlaps one read operation. Thus, in such a system only a single extra bank is required since only the one write operation that overlaps with a read operation can only conflict with that read operation. The second read operation and the second write operation will not conflict with any other operation since those operations are performed sequentially without any other.

In addition to reducing the amount of memory banks needed, the memory device performance required from the virtualized memory mapping table can also be reduced. As set forth previously, the systems implemented using the techniques of the present disclosure generally require fast memory systems to implement the virtualized memory mapping tables. However, by delaying the first write operation as illustrated in FIG. 15G, the performance requirements of the virtualized memory mapping table may be reduced. Specifically, the virtualized memory mapping table does not immediately have to determine both the physical location of the first read data and the physical location where the first write store data. Instead, the virtualized memory mapping table first locates the address for the first read operation. Then, while the first read operation is being performed, the virtualized memory mapping table is accessed to determine the physical write location for the first write operation and the physical read location for the second read operation.

As illustrated in embodiments of FIGS. 15F and 15G, there is extra memory access bandwidth that is not being used. For example, in FIG. 15F, there is available memory bandwidth when the second read and second write operations are being performed. This extra bandwidth may be used to move data stored in the extra memory bank back into the originally assigned physical memory address for the data's virtual address. In this manner, the requirements of the extra memory bank are being reduced since data is being put back into the main physical memory when possible. Thus, it may be possible to reduce the size of the added memory bank without affecting performance.

The methods of FIGS. 15F and 15G may be used to implement various other permutations of reads and writes. For example, FIG. 15H illustrates an implementation wherein two reads and three writes are performed within a single memory cycle in a manner that still only requires one extra memory bank. Only one extra memory bank is required since there will be at most two different memory access operations accessing the physical memory at the same time.

Non-Even Multiple Asymmetric Memory Fractional Performance Gains

Figure 15I:
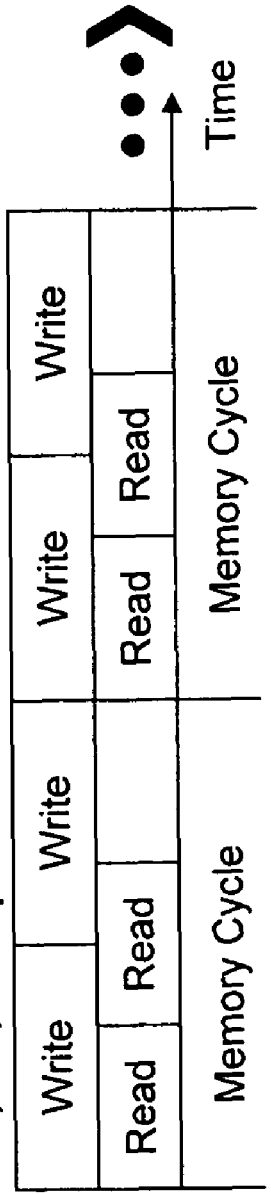
FIG. 15I illustrates a timing diagram for a virtualized memory system with asymmetrical read and write operations.
Figure 15J:
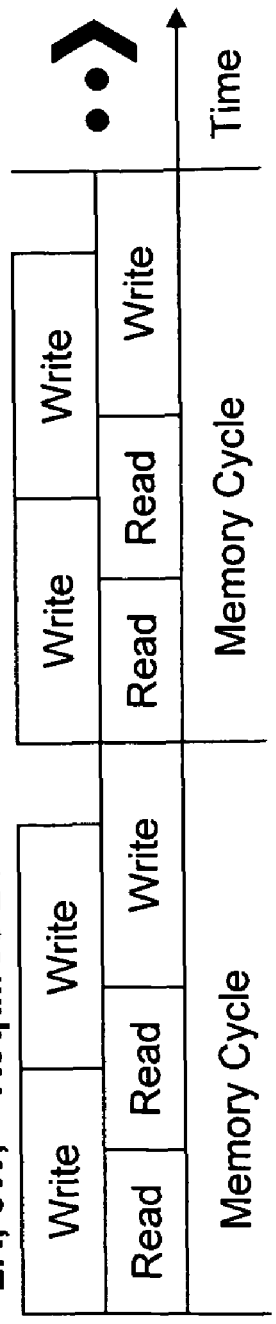
FIG. 15J illustrates a timing diagram of FIG. 15I wherein a third write operation has been added sequentially after the two read operations to obtain a fractional performance gain.

The techniques of performance gains from asymmetric memory devices and fractional performance gains may be combined to create a large number of different memory systems that each have their own unique characteristics. For example, FIGS. 15I and 15J illustrate how a system may obtains fractional gains using asymmetric memory devices. As illustrated in FIG. 15I, the write operation takes longer to complete than the read operation. If two consecutive write operations were performed in parallel with two consecutive read operations, the system would require two memory banks. However, notice that there is extra time wasted after the two consecutive read operations. If another write operation is added after the two consecutive read operations as illustrated in FIG. 15J, the system may perform two read operations and three write operations by only slightly extending the length of the memory cycle.

Fractional Cycle Types

If a read cycle requires 2 nanoseconds and a write cycle requires 6 nanoseconds then an even multiple of 3 reads and three writes can be achieved by using 6 nanosecond memory cycle. An example of this is illustrated in FIG. 15K. This system provides an independent operation time of 1 nanosecond per operation since 6 operations are completed in 6 nanoseconds. However, this arrangement will require 5 extra memory banks and a large amount of logic.

If the system is reduced to 2 reads and two writes in the 6 nanosecond cycle time then four memory operations are accomplished in 6 nanoseconds. An illustration of the timing diagram for this arrangement is illustrated in FIG. 15L. This system will require only 3 extra memory banks. The four memory operations are accomplished in 6 nanoseconds can be considered to have a fractional cycle time of 1.5 nanoseconds.

The fractional system of FIG. 15L can be refined further. If the system is designed with a 12 nanosecond cycle, then four reads and writes can be accomplished. FIG. 15M illustrates the timing diagram of such a system. In the system of FIG. 15M, the worst case scenario is one write overlapping two reads such that only two extra memory banks are required. Thus, the system of FIG. 15M has a fractional cycle time of 1.5 nanoseconds (12 nanoseconds/8 operations) but only requires two memory banks instead of three.

An Inverted XOR System that Uses No Mapping Table

In preceding memory systems, the memory read operation was always given priority since the data that needs to be read only existed in one place in the memory. If the write operation was given priority in the preceding systems, then a memory bank conflict between the write operation and the read operation would force the read operation to wait until the write was finished. However, if the data from every memory address was represented in at least two different memory banks in the memory system, then write operations could be given priority since the read operation could be performed from either of the two different places. Specifically, if there were a potential conflict between the read operation and the write operation at one of the memory banks then the read operation could access the requested data from the second copy of the data in the location in another memory bank. A memory system that operates in this manner wherein the write is given priority over the read option may be labeled as an 'inverted' memory system.

Creating such an inverted memory system is not trivial. To simply represent every piece of data in two different memory banks would merely be the creation of an entire duplicate memory system. A duplicate memory system would not be a very efficient manner of creating a memory system.

Figure 16:
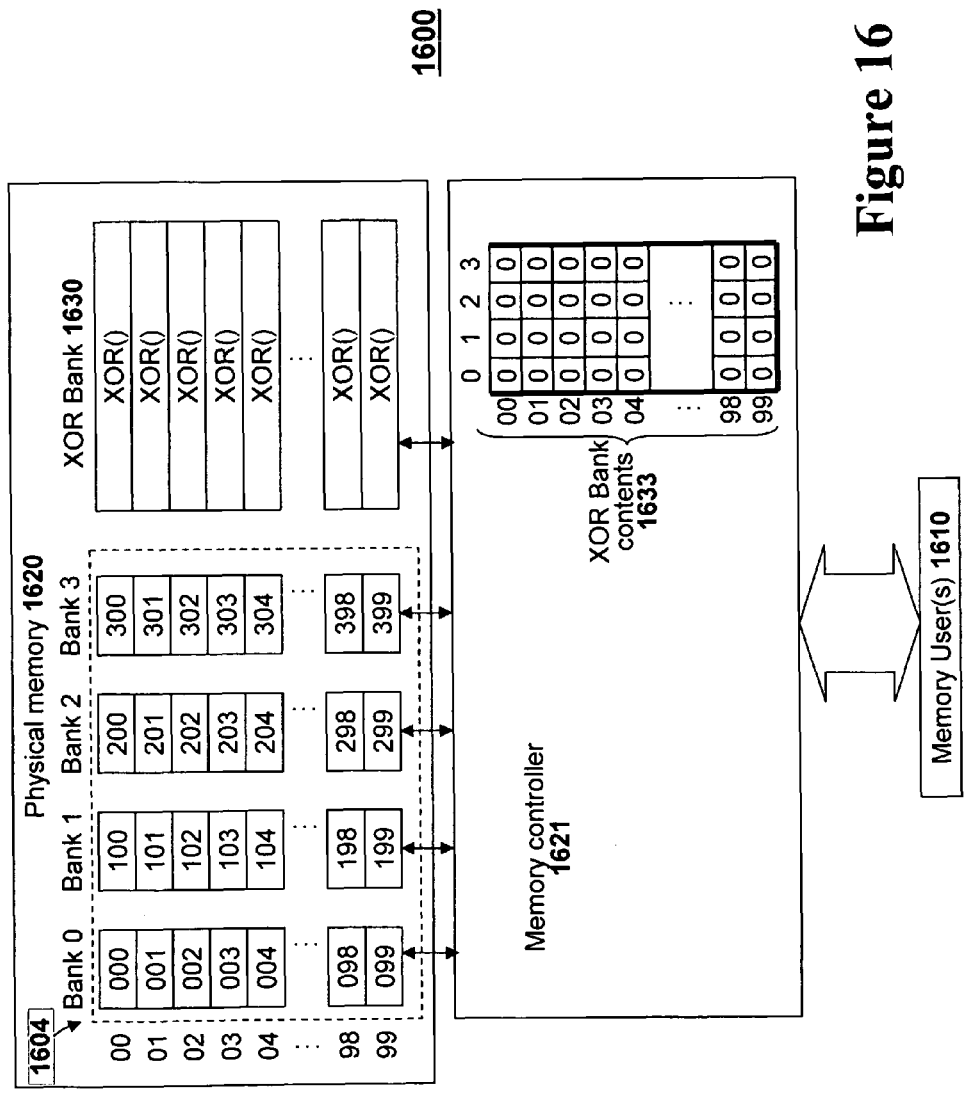
FIG. 16 illustrates an initial state of a virtualized memory system that handles one read and one we write operation simultaneously wherein the write operation is given priority over the read operation.

To create an inverted system wherein write operations are given priority over a simultaneous read operation, a new system is disclosed wherein a single extra high-speed memory bank is added to a set of existing memory banks to store an encoded second copy of data. The encoded second copy may be a combination of the data from all the normal memory banks combined with a logical exclusive-OR (also known as 'XOR') operation. Since writes are given priority and a logical exclusive-OR is used to encode a second copy of data, the system is referred to as an 'inverted XOR' memory system. FIG. 16 illustrates a block diagram of the inverted XOR memory system.

As illustrated in FIG. 16, a set of addresses 000 to 399 are stored into a set of memory banks 1604 wherein each memory bank is associated with addresses having a particular most significant digit of the memory address. (In FIG. 16, bank 0 is associated with virtualized addresses having '0' as the most significant digit, bank 1 is associated with virtualized addresses having '1' as the most significant digit, and so on.) In addition to the main memory banks 1604 is an XOR memory bank 1630. The memory controller 1621 will store an exclusive-OR encoded version of all the data that has been written into the corresponding rows of all the main memory banks (banks 0 to 3) into the XOR memory bank 1630. In the inverted XOR memory system, no detailed mapping table is required in the memory controller 1621 to keep track of where each pieces of data resides since the data will always reside in its original location. However, only a very small XOR bank contents table 1633 is required to keep track of which memory banks have valid data represented in the XOR bank 1620.

In the system of FIG. 16, all write operations will store information into both the main memory 1604 and the corresponding row of the XOR bank 1630. The write into the main memory 1604 uses the address specified in the write operation. The write operation into the corresponding location in the XOR bank 1630 must first read the location of the XOR bank 1630, then logically combine the new data with the existing data from the corresponding location of other memory banks with an XOR operation, and then write the new combined value back in the corresponding location in the XOR bank 1630. Thus, a high-speed memory is required to implement the XOR bank 1630. The XOR encoded data is used to handle read operations as will be set forth below.

The inverted XOR memory system embodiment of FIG. 16 must be implemented as a 'read once' memory system wherein data is destroyed upon being read or a 'last read specified' system wherein a user of the memory system must specify when the last read of a particular memory location occurs. The reason for this is that when the memory controller 1621 writes to the memory system, the memory controller 1621 needs to be writing to an empty memory location. The memory controller 1621 can only write to an empty memory location since the memory controller 1621 does not have the time to first read existing data from the memory location, remove that data from the XOR bank 1630, and then write the new data into the main memory location and the XOR bank 1630 location.

When a read request and a write request are received which do not cause a memory bank conflict occurs, then the read and write operations can occur simultaneously in the main memory banks 1604. However, read and the write may both need to access the XOR bank 1630. As set forth above, the write operation must always access the XOR bank 1630 in order to add the XOR encoded data into the XOR bank 1630. If the read operation is the last read of that memory location (or the implementation is a 'read once' implementation that always destroys data), the read operation will also have to access the XOR bank 1630 to remove the XOR representation of the data from the XOR bank 1630. Since both the read operation and the write operation may need to read, modify, and write the XOR bank 1630; the XOR bank must support two read operations and two write operations in a single memory cycle. Thus, the XOR bank may need to be a 4-ported memory device.

When a memory bank conflict does occur (the memory read and memory write operations are both directed toward addresses in the same memory bank), the memory write operation is given priority to access the memory bank in the main memory 1604. In addition, the write operation must also update the corresponding location in the XOR bank 1630. The memory read (which cannot access the same bank in the main memory 1604 that the write is accessing) is handled by retrieving the corresponding location of XOR coded version from the XOR bank 1630, retrieving the data from the correspond locations of the other memory banks that have valid data coded into XOR bank 1630, and then decoding the XOR coded version to obtain the requested data. The decoding is performed by combining all of this data with an XOR operation. Note that the XOR bank contents table 1733 is used to select only those memory banks that currently have valid data in the corresponding location of the XOR bank 1630. If this is not the last read for this memory location, then the corresponding location in the XOR bank 1630 may remain unchanged. However, if this is the last read for this particular location, the read operation must write back an XOR encoded version that contains the data from the other rows having valid data but not the data that just read.

Figure 17A:
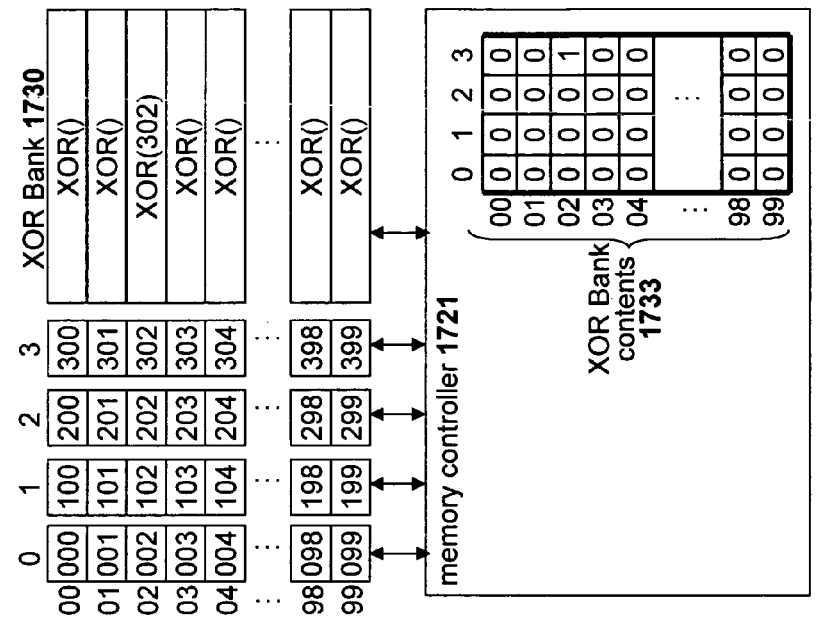
FIG. 17A illustrates an initial state of a virtualized memory system constructed using the teachings of FIG. 16 receiving an initial memory write operation.

Examples of the operation of an inverted XOR memory system are set forth with reference to FIGS. 17A to 17F. FIG. 17A illustrates the memory system in an empty initial state. A first write operation is received into the memory system addressed to address location 302. The memory controller 1721 writes the data into memory location 302 in the main memory and XORs the data into the same row of the XOR bank. Since the XOR bank 1730 was empty, the XOR was with null such that the 02 row in the XOR bank 1730 will merely contain the same data that was written to address 302. The memory controller 1721 then updates the XOR Bank contents table 1733 to indicate that the 02 row of the XOR bank 1730 contains data from row 02 of main memory bank 3. The final state after the write to location 302 is illustrated in FIG. 17B.

Figure 17B:
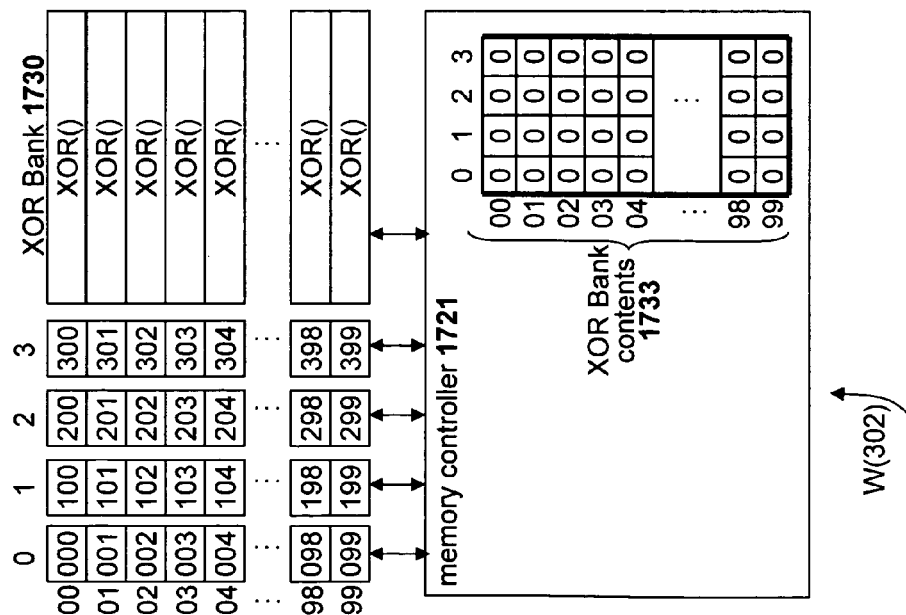
FIG. 17B illustrates the state of the virtualized memory system of FIG. 17A after handing an initial write operation.
Figures 17C, 17D:
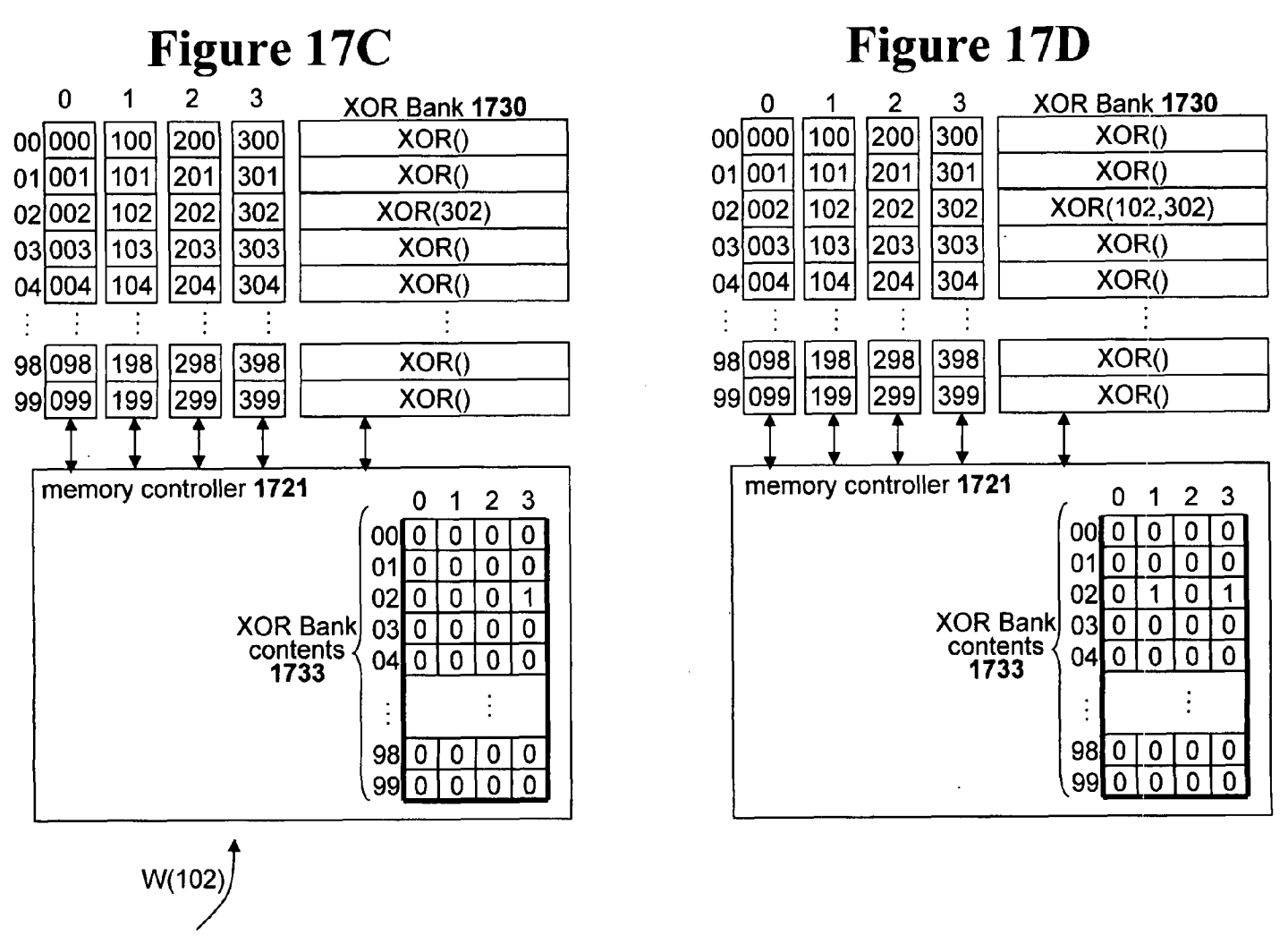

FIG. 17C illustrates the system with the state from FIG. 17B receiving a write to address 102. The data is written into the 102 location of the main memory and the XOR bank 1730 is also updated. Specifically, row 02 of the XOR bank 1730 is read, combined with the new data using an exclusive-OR operation, and then written back into row 02 of XOR bank 1730. The XOR Bank contents table 1733 is also updated to reflect that row 02 of the XOR bank 1730 now contains both data from bank 1 and bank 3. The final state after the write to address 102 is illustrated in FIG. 17D.

Figures 17E, 17F:
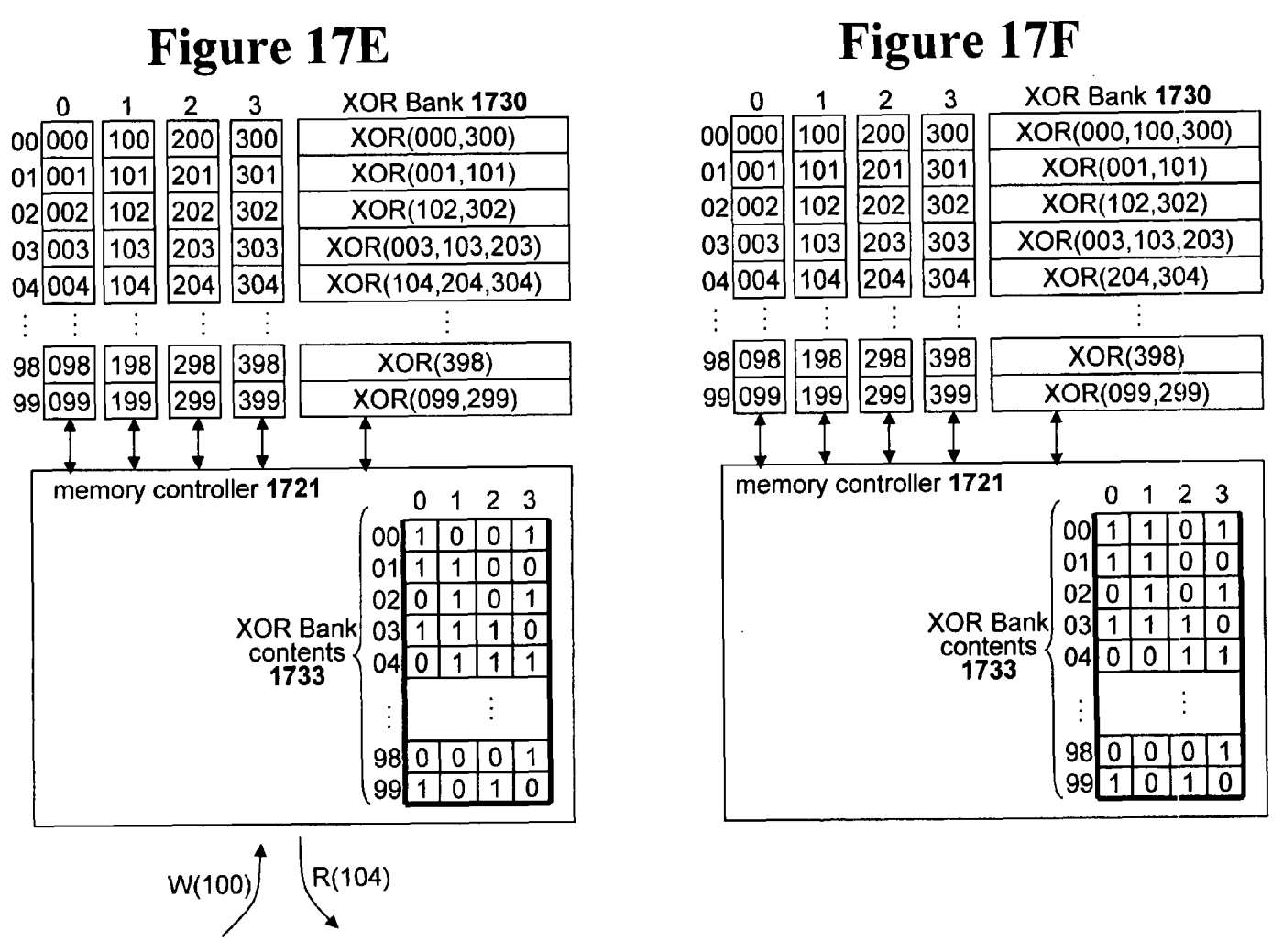

The memory system will continue to fill up in this manner. FIG. 17E illustrates an example state of the memory system after more data has been added. The system of FIG. 17E may then receive a write to address 100 and a read from address 104 simultaneously as illustrated. The write is given priority and the data associated with the write operation is written into address 100 in the main memory bank. In addition, the 00 row from the XOR bank 1730 is read, XORed with the data value written to address 100, written back to the 00 row of the XOR bank 1730, and the XOR bank contents table 1733 is updated to indicate that the row 00 of the XOR bank 1730 now also contains data from memory bank 1.

The read from address 104 cannot be handled by reading the data directly from address 104 in the main memory due to a bank conflict with the write to location 100. So the read must be handled using the XOR bank 1730 and the other main memory banks. The memory controller first reads row 04 of the XOR bank contents table 1733 to identify which main memory banks have data represented in row 04 of the XOR bank 1730. Row 04 of the XOR bank contents table 1733 specifies that banks 1, 2, and 3 all have data XORed in row 04 of the XOR bank 1730. The memory controller then reads row 04 of the XOR bank 1730 and the 04 rows of the other banks (banks 2 and 3) that have data represented in row 04 of the XOR bank 1730. Thus, the memory controller reads row 04 of bank 2, bank 3, and the XOR bank 1730. The data read from these three locations are XORed together to obtain the original data from address 104 that is used to respond to the read request. The memory controller then XORs the row 04 data from banks 2 and 3 and then writes that value back to row 04 of the XOR bank 1730. Finally, the XOR bank contents table 1733 is updated to indicate that the data from address 104 is no longer represented in the XOR bank 1730.

As set forth above, the system always removes data from the XOR bank after the last read operation (whether the data is read from the main memory bank or the XOR bank) to empty the location for a subsequent write. In a read once memory system, the memory controller would remove the representation from the XOR bank after every read operation. In an alternate system, the memory user could use another signal line to specify if a read is the last read of the data. If the read is not the last read, then data will remain in the main memory location and represented in the encoded XOR bank. Thus, the memory user could then repeatedly read from an address without destroying the contents in that address. However, the processor would need to ensure that it performs a 'last read' operation to that address before writing any new information into that address. Otherwise, the data in corresponding row of the XOR bank will become corrupted. Note that this corruption would not only harm the data associated with that particular address, the data represented in the XOR bank associated with same row from all the other memory banks would also be corrupted. The data in the main memory location does not need to be changed since it will be overwritten when the later write operation is received.

The XOR system disclosed with reference to FIGS. 16 to 17F has features that make it advantageous in some applications but less than ideal in other applications. One nice feature of the XOR system is that a large mapping table does not need to be stored in the memory controller. Instead, just an XOR bank contents table that contains a single bit for each memory address is required. The XOR system is not ideal for wide data values since parallel data paths from all of the different memory banks (including the XOR bank) must be routed to the memory controller in order to use the XOR bank properly. Furthermore, the XOR system may use more power than other systems since every time a memory bank conflict occurs, the system will access the memory bank being written to, the XOR bank, and every other memory bank that has data represented in the XOR bank for the same row that is being read.

Unconstricted Memory Virtualization Systems

In the various memory systems described in the previous sections, the memory systems are organized into distinct memory banks and rows (and sometimes columns) within those memory banks. One or more extra similar memory banks are then added to the memory system to prevent memory bank conflicts from reducing the performance of the memory system. A virtualized memory mapping table is then used to keep track of where the various different virtualized memory addresses are currently represented within the physical memory system.

To limit the size of virtualized memory mapping table, the embodiments described in the earlier sections restrict the physical memory locations where each virtualized memory address can be stored. For example, in the virtualized memory systems of FIGS. 6A and 6B, each virtualized memory address stored in the memory system can only be represented in physical address rows having the same two least significant digits. Thus, for example, address 101 can only be stored in the 01 row of physical memory banks A to E. Although this constriction provides an advantage (reducing the size of the memory mapping table), a system may be constructed that does not have any such restriction.

Figure 18:
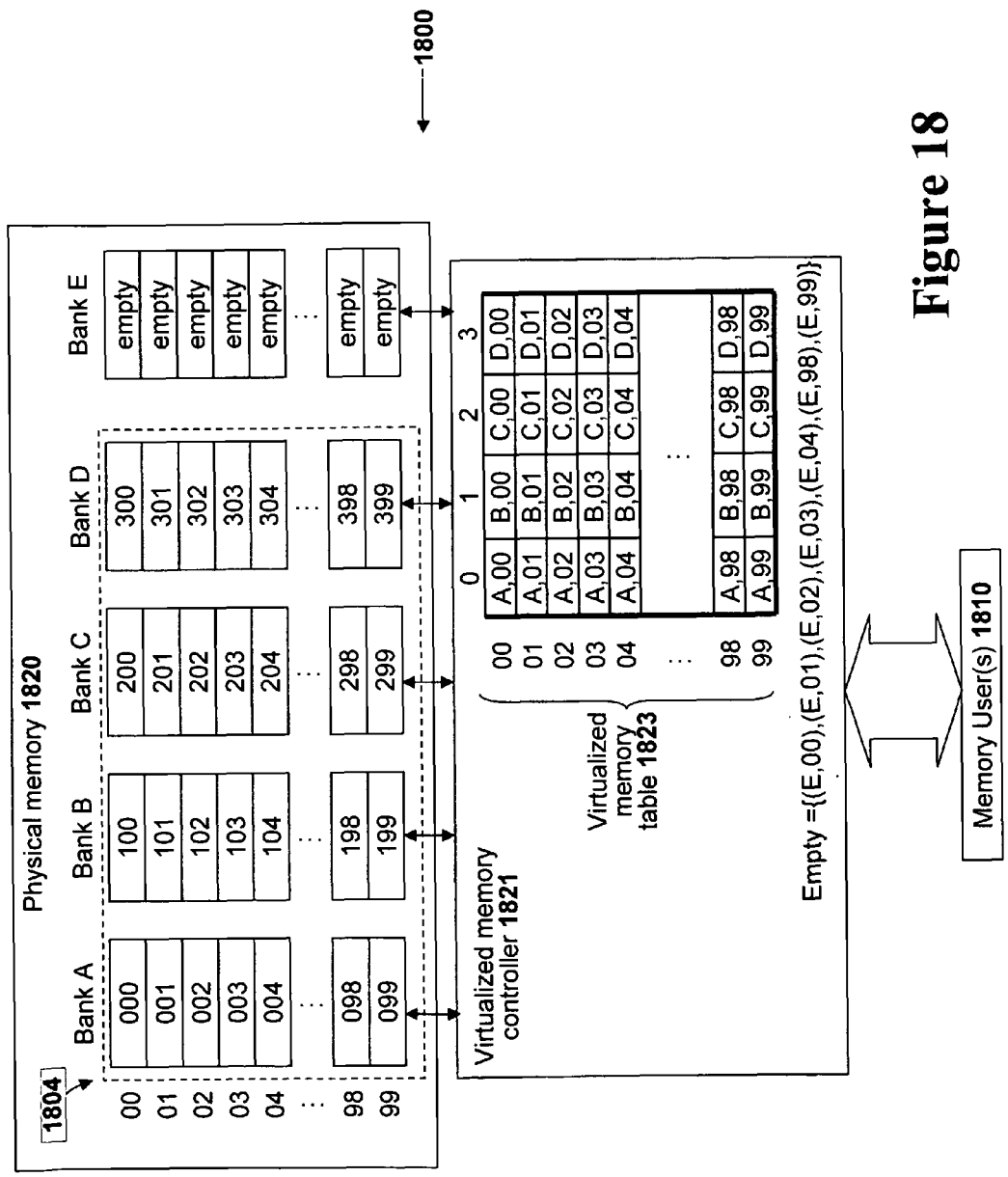
FIG. 18 illustrates an unconstricted virtualized memory system wherein any virtualized address may be placed in any physical address.

FIG. 18 illustrates an example memory system that allows each and every virtualized memory address to be represented in any of the physical memory address. Referring to the virtualized memory table 1823, the physical location of any virtualized address can be determined by accessing the column of the virtualized address most significant digit and the row of the virtualized address two least significant digits to obtain a table entry that specifies the memory bank and row where the virtualized address is located. Note that since any virtualized address can be located at any physical address, there is no need for an "empty" column in the virtualized memory table 1823. Instead, the empty physical memory addresses may instead be stored in a simple unordered set since there is no relevant difference between the various different empty physical addresses. However, in an alternate embodiment, the empty physical addresses may be stored in a free list or other typical memory allocation list like data structure.

At first glance, the memory system of FIG. 18 may appear to be not very useful since the virtualized memory table 1823 is very large. However, if the size of the data referenced by the actual virtualized memory addresses is very large then such a system does have useful applications. For example, if each of the virtual addresses references a large block of memory then the memory system of FIG. 14A will have some useful applications.

One example usage of the unconstricted memory system is for dynamic memory block allocation. In a modern computer system, there are a number of different computer resources (processor time, memory, an output device, etc.) and a number of different independent processes that use those computer resources. One of the prime functions of a computer operating system is to coordinate the allocation of the computing resources to the various different processes that request computing resources. In the 'C' family of programming languages, the malloc( ) function is used by a process to dynamically request that the operating system give the process some additional memory. With modern multiple core processors, the different processes may actually be running on physically different cores such that the different processes are running fully concurrently and not just an appearance of concurrency using time division multiplexing. To allows independent processes to run at the best possible speed, the memory system of FIG. 14A may be used to allocate memory blocks from different memory banks such that there will be no memory back conflicts caused by two independent processes attempting to access data stored within the same memory bank.

In another application, the techniques of the disclosed memory systems may be used with linked lists of memory blocks. Linked lists of memory blocks are commonly used in memory allocation systems and in packet buffering queues. With the memory systems of the present disclosure, the system keeps track of which particular physical memory bank that each virtualized memory location resides within. Thus, the memory system can be used to allocate memory blocks for a linked list in a manner that will minimize memory bank conflicts.

In one embodiment, the memory system may allow memory users (such as processes that data packet queues) to make memory requests using logical addresses. These different memory queue processes may request blocks of memory using logical addresses. For example, if there are three memory queue processes 0, 1, and 2 (such as processes associated with data packet queues) and each different memory queue process requests blocks of memory using a simple logical address, then a memory system may keep track of each memory request and the corresponding memory blocks. Each memory request can be identified by a memory queue process identifier and logical block address for that queue like this: (queue identifier, logical address). Thus, when a first memory queue process makes a first (logical address 0) memory request, the memory system will associate (0,0) for that first memory request. That (0,0) identifier will be associated with the physical address of memory block provided. When the same memory queue process requests a second (logical address 1) memory request, the memory system will associate (0,1) with the memory block address provided in response to the request.

With such a system, the memory system may make intelligent memory allocation decisions. For example, since the memory system knows which memory queue process makes each memory request, the memory system can attempt to respond to requests from the same memory queue process with memory blocks from the same memory bank since a memory queue process will generally access only one memory block at a time thus there will not be any memory bank conflicts. Similarly, the memory system will attempt to give other memory queues processes memory blocks from different memory banks since the different memory queues processes make perform simultaneous memory accesses to their respective allocated memory blocks. Thus, if the memory blocks are from different memory banks, there will be no memory bank conflicts that will reduce performance. Of course in the other extreme, the memory queues can be given data from different memory banks in order to load balance the requests across all the different memory banks and maximize the bandwidth utilization of the memory for every queue.

Partially Constricted Memory Virtualization Systems

In between strictly constricted memory systems wherein the locations where each virtualized memory address may be located in physical memory is very restricted and unconstricted memory systems wherein any virtualized memory address can be located in any physical memory location, there lies a wide variety of different partially restricted implementations. For example, instead of restricting a virtualized address to always being in a particular row (as depicted in the implementations of FIGS. 6A and 6B), a partially restricted memory system may allow the virtualized address to be represented in a specific row or in a nearby row as specified by offset bits. For example, with two offset bits, a particular virtualized address may be specified to exist within a specific designated row or in one three nearby rows. For example, 10 may specify two before the designated row, 11 may specify one row before the designated row, 00 may specify the designated row, and 01 may specify the row after the designated row.

A Write-Buffer Only Conflict Avoidance System

With a good memory interleaving system and sufficiently random memory access patterns, a high-speed memory system may be implemented without the need for any extra memory banks. Instead, a write-buffer may be used to handle the (hopefully) rare memory bank conflicts.

Figure 19:
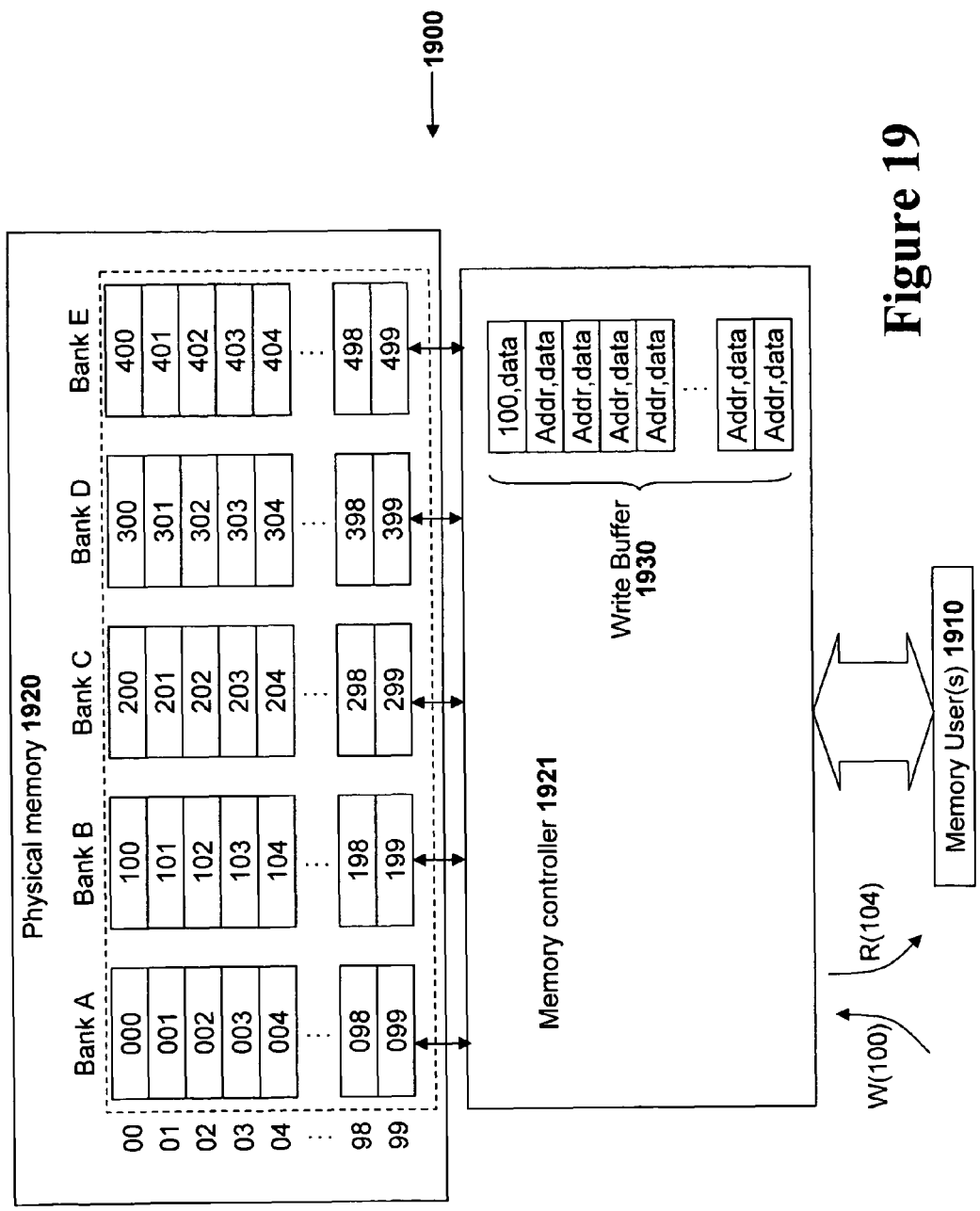
FIG. 19 illustrates a memory system that avoids any memory bank conflicts from reducing performance by using a write-buffer.

FIG. 19 illustrates an example of a memory system 1900 made up of a physical memory 1920 that is made up of different memory banks that may be accessed simultaneously and a memory controller 1921. The memory system 1900 is designed to handle more than one simultaneous memory operation. In a simple embodiment, the memory system 1900 may handle one read memory operation and one write memory operation. As long as the simultaneous read and write operations access different memory banks, there is no memory bank conflict and the read and write operations can be performed simultaneously.

When a read operation and write operation attempt to access memory locations located in the same memory bank (as indicated by the write to address 100 and the read from address 104), then there is a memory bank conflict such that only one of the two operations can take place. Since the read operation can only be handed by accessing that one specific memory location, the read is given priority such that the memory controller reads from address 104 and responds to the read request. The write operation, which cannot be handled with the physical memory 1920 due to the memory bank conflict, is instead placed into a write buffer 1930 as illustrated in FIG. 19. If a memory read from address 100 is received while the write operation exists within the write buffer 1930, then the memory controller will respond to the read request with the data from the write buffer 1930.

In the memory cycles after placing the write operation to address 100 in the write buffer 1930, the memory controller 1921 will attempt to complete the write operation by moving the data from the write buffer 1930 into the physical memory 1920. This can be performed in subsequent memory cycles as long as there are no memory bank conflicts with the address of the write operation. For example, if in the following memory cycle the system receives a read from address 204 and a write to address 401 then the data from the earlier write to address 100 can be performed simultaneously with the read from address 204 and the write to address 401. However, if either the read operation or the write operation access the same memory bank, the write operation data will remain in the write buffer 1930.

Note that in a memory cycle, write operations may be both added to and removed from the write buffer 1930. For example, If the memory system already has a write operation to address 100 in the write buffer 1930 as illustrated in FIG. 19 and then subsequently receives a read from address 400 and a write to address 499, then the memory system will perform both reads and writes into the write buffer 1930. Specifically, the write operation to address 499 will be added to the write buffer 1930 (due to the conflict with the read from address 400) and the write operation to address 100 in the write buffer 1930 will be removed from the write buffer 1930 since the data will be written into physical address 100. In addition, multiple write operations from the write buffer 1930 may be written into the physical memory 1920 during the same memory cycle. For example, if in the previous example the write buffer 1930 also included a write operation to address 205, the memory controller 1921 could simultaneously write to address 100 and address 205 while performing the read from address 400.

In such a memory system with a write buffer used to avoid memory conflicts, the system may provide high speed performance as long as there are enough different memory banks to reduce bank conflicts, the memory banks are well-interleaved to spread memory accesses among different memory banks, and the memory access requests are sufficiently random.

However, if a long series of read and write operations to the very same memory bank is received, the write buffer 1930 will eventually become filled up such that memory system will eventually need to pause or slow down memory requests in order to write-back some (or all) of the buffered write operations. To reduce the probability of this situation, a hashing mechanism may be used to add a randomization aspect to the system. Specifically, the memory controller 1921 may pass the virtual or physical addresses through a hashing mechanism that randomizes the addresses but still maintains a one to one relationship between addresses and locations in physical memory. In this manner, even if a particular pattern of addresses is received, the hashing mechanism will randomize the addresses thus reducing the probability of a memory access pattern that causes a repeated series of memory bank conflicts.

Memory System with Smaller Extra Memory Bank

In the virtualized memory systems of FIGS. 6A and 6B, the memory systems have an extra memory bank (Bank E) that is the same size as the other memory banks in the physical memory 620. In this manner, there is always another memory location in a different memory bank that can be written to if there is a memory bank conflict. However, if there is a large number of memory banks, a full sized extra bank may not be necessary since there may be few memory bank conflicts.

Figure 20:
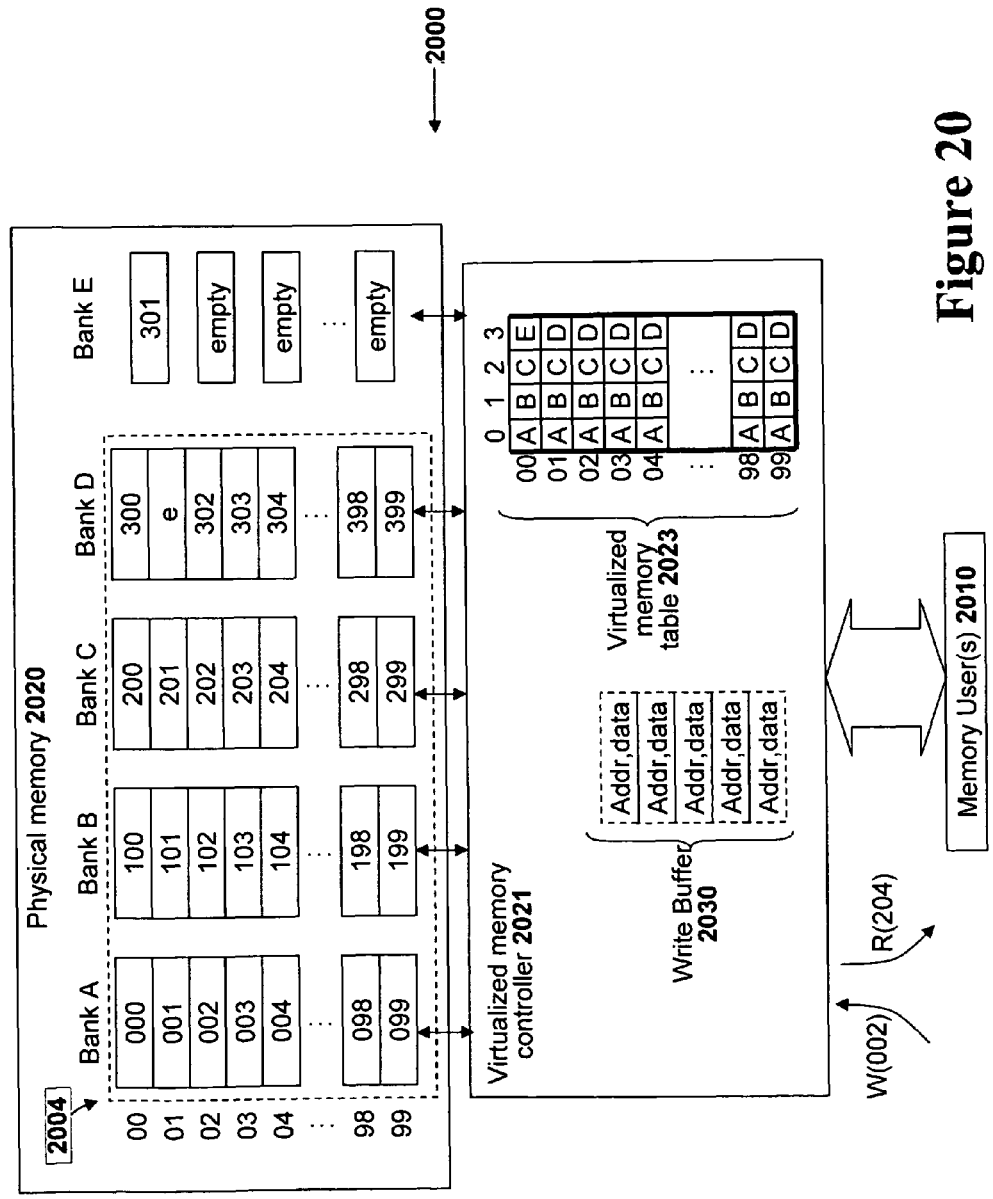
FIG. 20 illustrates a virtualized memory system with an extra memory bank that is smaller than the main memory bank and which may also include a write buffer.

FIG. 20 illustrates a virtualized memory system 2000 wherein the extra memory bank (bank E) only has single row for every two rows of the main memory banks. As long as there are no memory bank conflicts, bank E is not needed at all. When a memory bank conflict does occur, the data from the write operation may be placed into one of the rows in the extra memory bank E. To prevent a situation where a subsequent memory bank conflict occurs and no freely available location is available due to the designated extra memory bank row already being used, the virtualized memory controller 2021 may attempt to move data from bank E to its original place in the main memory area 2004. For example, if the first row of memory bank E is storing the data for virtualized address 301 and then a read from address 204 and write to address 002 is received (all as depicted in FIG. 20), then the virtualized memory controller 2021 may write the data associated with address 301 in the memory bank E back to memory bank D (where address 301 was originally represented) while simultaneously performing the read from address 204 and write to address 002.

For additional protection, a write buffer 2030 may be added to handle the times when there is no place to immediately write some data due to a memory bank conflict and the designated row of bank E already being used. As with bank E, the virtualized memory controller 2021 may attempt to move data from write buffer 2030 to its original place in the main memory area 2004. Between the usage of a reduced size extra memory bank E and an added write buffer 2030, the probability of having the memory system 2000 have to stall due to memory bank conflicts can be made very small.

As with the preceding memory system that only used a write buffer, a memory system with reduced size extra bank may benefit from the use of a hashing mechanism. A hashing mechanism will randomize the memory access pattern such that the probability of encountering a series of repeated memory bank conflicts will be reduced.

The preceding technical disclosure is intended to be illustrative, and not restrictive. For example, the above-described embodiments (or one or more aspects thereof) may be used in combination with each other. Other embodiments will be apparent to those of skill in the art upon reviewing the above description. The scope of the claims should, therefore, be determined with reference to the appended claims, along with the full scope of equivalents to which such claims are entitled. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim is still deemed to fall within the scope of that claim. Moreover, in the following claims, the terms "first," "second," and "third," etc. are used merely as labels, and are not intended to impose numerical requirements on their objects.

The Abstract is provided to comply with 37 C.F.R. §1.72(b), which requires that it allow the reader to quickly ascertain the nature of the technical disclosure. The abstract is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment.

We claim:

1. A method of handling memory access requests in a digital memory system, said digital memory system comprising a plurality of memory banks wherein each of said plurality of memory banks may operate concurrently and independent of each other, said method comprising:

receiving a first memory access request, said first memory access request identifying a first virtualized memory address in a virtualized memory address space;

using said virtualized memory address as an index into a changeable memory mapping table to obtain a first memory bank identifier that identifies a first memory bank of said plurality of memory banks currently storing data associated with said first virtualized memory address, said digital memory system having a physical address space larger than said virtualized memory address space;

handling said first memory access request by accessing said first memory bank using a first physical memory address, said first physical memory address comprising said first memory bank identifier and a subset of said first virtualized memory address;

simultaneously receiving a second memory access request along with said first memory access request, said second memory access request comprising a write operation, said second memory access request identifying a second virtualized memory address in said virtualized memory address space;

writing data from said second memory access request to a new second physical memory address in a second memory bank if a second physical address currently associated with said second virtualized memory address is located within said first memory bank being used to service said first memory access request; and updating said changeable memory mapping table to associate said new second physical memory address with said second virtualized memory address.

2. The method of handling memory access requests as set forth in claim 1 wherein said changeable memory mapping table comprises a set of columns equal to a number of memory banks in said plurality of memory banks.

3. The method of handling memory access requests as set forth in claim 2 wherein said changeable memory mapping table and said plurality of memory banks have an equal number of rows.

4. The method of handling memory access requests as set forth in claim 2 wherein each entry in said changeable memory mapping table stores a memory bank identifier value.

5. The method of handling memory access requests as set forth in claim 1 wherein said physical memory address space comprises N memory banks and said virtualized memory address space occupies a subset of said physical memory address space of a size of N−1 memory banks.

6. The method of handling memory access requests as set forth in claim 1, said method further comprising:
   simultaneously receiving a third memory access request along with said first memory access request and said second memory access request, said third memory access request comprising a write operation, said third memory access request identifying a third virtualized memory address in said virtualized memory address space;
   writing data from said third memory access request to a new third physical memory address in a third memory bank if a third physical address currently associated with said third virtualized memory address is located within said first memory bank being used to service said first memory access request or within said second memory bank being used to service said second memory access request; and
   updating said changeable memory mapping table to associate said new third physical memory address with said third virtualized memory address.

7. The method of handling memory access requests as set forth in claim 1 wherein said changeable memory mapping table comprises a plurality of rows, each of said plurality of rows comprising a plurality memory bank identifiers.

8. The method of handling memory access requests as set forth in claim 7 wherein a first memory bank identifier in each row comprises an absolute memory bank identifier and the remainder of memory bank identifiers in each row comprises a relative memory bank identifier relative to said absolute memory bank identifier.

9. The method of handling memory access requests as set forth in claim 7 wherein a first memory bank identifier in each row comprises an absolute bank identifier, a first subset of remaining memory bank identifiers in each row comprises a first relative memory bank identifier relative to said absolute memory bank identifier, and a second subset of remaining memory bank identifiers in each row comprises a second relative memory bank identifier relative to said absolute memory bank identifier having fewer bits than said first relative memory bank identifier.

10. A digital memory system for handling memory access requests, said memory access requests addressing a virtualized memory address space, said digital memory system comprising:
   a plurality of memory banks, each of said plurality of memory banks able to operate concurrently and independent of each other, said plurality of memory banks forming a physical address space larger than said virtualized memory address space;
   a changeable memory mapping table, said changeable memory mapping table mapping said virtualized memory address space into said physical memory address space; and
   a memory controller, said memory controller receiving a first memory access request identifying a first virtualized memory address, indexing into said changeable memory mapping table to obtain a first memory bank identifier that identifies a first memory bank of said plurality of memory banks currently storing data associated with said first virtualized memory address, handling said first memory access request by accessing said first memory bank using a first physical memory comprising said first memory bank identifier and a subset of said first virtualized memory address, said memory controller simultaneously receiving a second memory access request along with said first memory access request, said second memory access request comprising a write operation to a second virtualized memory address, said memory controller writing data from said second memory access request to a new second physical memory address in a second memory bank if a second physical address currently associated with said second virtualized memory address is located within said first memory bank being used to service said first memory access request, and said memory controller updating said changeable memory mapping table to associate said new second physical memory address with said second virtualized memory address.

11. The digital memory system for handling memory access requests as set forth in claim 10 wherein said changeable memory mapping table comprises a set of columns equal to a number of memory banks in said plurality of memory banks.

12. The digital memory system for handling memory access requests as set forth in claim 11 wherein said changeable memory mapping table and said plurality of memory banks have an equal number of rows.

13. The digital memory system for handling memory access requests as set forth in claim 11 wherein each entry in said changeable memory mapping table stores a memory bank identifier value.

14. The digital memory system for handling memory access requests as set forth in claim 10 wherein said physical memory address space comprises N memory banks and said virtualized memory address space occupies a subset of said physical memory address space of a size of N−1 memory banks.

15. The digital memory system for handling memory access requests as set forth in claim 10 wherein said memory controller simultaneously receives a third memory access request along with said first memory access request and said second memory access request, said third memory access request comprising a write operation to a third virtualized memory address, said memory controller writes data from said third memory access request to a new third physical memory address in a third memory bank if a third physical address currently associated with said third virtualized memory address is located within said first memory bank being used to service said first memory access request or within said second memory bank being used to service said second memory access request, said memory controller updating said changeable memory mapping table to associate said new third physical memory address with said third virtualized memory address.

16. The digital memory system for handling memory access requests as set forth in claim 10 wherein said changeable memory mapping table comprises a plurality of rows, each of said plurality of rows comprising a plurality memory bank identifiers.

17. The digital memory system for handling memory access requests as set forth in claim 16 wherein a first memory bank identifier in each row comprises an absolute memory bank identifier and the remainder of memory bank identifiers in each row comprises a relative memory bank identifier relative to said absolute memory bank identifier.

18. The digital memory system for handling memory access requests as set forth in claim 16 wherein a first memory bank identifier in each row comprises an absolute memory bank identifier, a first subset of remaining memory bank identifiers in each row comprises a first relative memory bank identifier relative to said absolute memory bank identifier, and a second subset of remaining memory bank identifiers in each row comprises a second relative memory bank identifier relative to said absolute memory bank identifier having fewer bits than said first relative memory bank identifier.

* * * * *